US007439614B2

(12) United States Patent
Inoue et al.

(10) Patent No.: US 7,439,614 B2
(45) Date of Patent: Oct. 21, 2008

(54) CIRCUIT DEVICE WITH DUMMY ELEMENTS

(75) Inventors: Yasunori Inoue, Gifu (JP); Ryosuke Usul, Aichi (JP); Yasuhiro Kohara, Gifu (JP); Nobuhisa Takakusaki, Gunma (JP); Takeshi Nakamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 3 days.

(21) Appl. No.: 11/139,238

(22) Filed: May 26, 2005

(65) Prior Publication Data

US 2005/0263846 A1 Dec. 1, 2005

(30) Foreign Application Priority Data

May 31, 2004 (JP) ........................... P2004-162658

(51) Int. Cl.
*H01L 23/12* (2006.01)
*H01L 23/053* (2006.01)
*H01L 23/34* (2006.01)

(52) U.S. Cl. ....................... 257/700; 257/717; 257/712; 257/713; 257/E23.101; 257/E23.106

(58) Field of Classification Search ................. 257/531, 257/678, 499, 506, 508, 787, 700, 712–713, 257/717, 723–724, E23.101, E23.106, E23.08
See application file for complete search history.

(56) References Cited

U.S. PATENT DOCUMENTS 6,081,142 A * 6/2000 Douchi et al. ............... 327/158
6,309,956 B1 * 10/2001 Chiang et al. ............... 438/622
6,399,897 B1 * 6/2002 Umematsu et al. .......... 174/261
6,717,267 B1 * 4/2004 Kunikiyo .................... 257/758
6,777,814 B2 * 8/2004 Iwasaki et al. .............. 257/778
2002/0000327 A1 * 1/2002 Juso et al. .................. 174/250
2002/0063305 A1 * 5/2002 Koike ......................... 257/529
2004/0152234 A1 * 8/2004 Usui et al. .................. 438/106
2006/0103017 A1 * 5/2006 Usui et al. .................. 257/725

FOREIGN PATENT DOCUMENTS

JP 06-177295 6/1994
JP 2001-345398 12/2001
JP 2003-008186 1/2003
JP 2004-047807 2/2004
JP 2004-259755 9/2004

* cited by examiner

*Primary Examiner*—Theresa T. Doan
*Assistant Examiner*—Sarah K Salerno
(74) *Attorney, Agent, or Firm*—Fish & Richardson P.C.

(57) ABSTRACT

In a manufacturing method of a hybrid integrated circuit device 10 according to the present invention, a first dummy pattern D1 is provided on a first wiring layer 18A. Furthermore, a second dummy pattern D2 is provided on a second wiring layer 18B. The first dummy pattern D1 and the second dummy pattern D2 are connected through a connection part 25 which penetrates an insulation layer 17. Hence, heat dissipation through a dummy pattern can be actively performed. In addition, even in the cases where a multi-layered wiring is formed, it is possible to provide a circuit device which can secure a heat dissipation property.

22 Claims, 17 Drawing Sheets

CIRCUIT DEVICE WITH DUMMY ELEMENTS

BACKGROUND OF THE INVENTION

Priority is claimed to Japanese Patent Application Number JP2004-162658 filed on May 31, 2004, the disclosure of which is incorporated herein by reference in its entirety.

1. Field of the Invention

The present invention relates to a circuit device, and particularly to a circuit device including a plurality of wiring layers, which are laminated with an insulation layer interposed between two wiring layers.

2. Description of the Related Art

With reference to FIGS. 17A and 17B, a configuration of a conventional hybrid integrated circuit device 100 is described (This technology is described for instance in Japanese Patent Application Laid-open No. Hei6 (1994)-177295.) FIG. 17A is a perspective view of the hybrid integrated circuit device 100, while FIG. 17B is a cross-sectional view taken along the line X-X' in FIG. 17A.

The conventional hybrid integrated circuit device 100 includes a substrate 106 which is rectangular, and an insulation layer 107 formed on a front face of the substrate 106. On this insulation layer 107, a wiring layer 108 is patterned. Further, a circuit element 104 is fixed to the wiring layer 108, while the circuit element 104 and the wiring layer 108 are electrically connected with a metal wire 105. A lead 101, which is electrically connected to the wiring layer 108, is routed to the outside. The hybrid integrated circuit device 100 is entirely sealed with a sealing resin 102. As a way of sealing with the sealing resin 102, there are an injection mold using a thermoplastic resin and a transfer mold using a thermosetting resin.

SUMMARY OF THE INVENTION

However, in the above-described hybrid integrated circuit device 100, while the substrate 106 made of a metal is adopted to enhance a heat dissipation property, there is a difficulty in effectively radiating heat internally generated to the outside since a thermal resistance of the insulation layer 107, which is formed on a front face of the substrate 106, is large. As a way of enhancing the heat dissipation property of the insulation layer 107, there is a technique whereby inorganic filler is mixed into the insulation layer 107. However, there is a problem that the heat dissipation property of the insulation film 107 into which the inorganic filler is mixed is not sufficiently high, as compared to a metal such as cupper.

The present invention was made in view of the above-described problems. The present invention provides a circuit device where a heat dissipation property is enhanced by forming a dummy pattern.

A circuit element of the present invention includes, in a circuit device including a plurality of wiring layers which are laminated to be multiply layered with an insulation layer interposed therebetween, the wiring layer is formed by a conductive pattern which is electrically connected to a built-in circuit element and which configures a part of an electric circuit, and by a dummy pattern which is electrically independent of the electric circuit.

Further, the circuit element of the present invention includes, in a circuit device including a plurality of wiring layers which are laminated to be multiply layered with an insulation layer interposed therebetween, in which a wiring layer is formed by a conductive pattern which is electrically connected to a built-in circuit element and through which an electric signal passes, and by a dummy pattern through which the electric signal does not pass.

Further, the circuit element of the present invention includes that the dummy pattern is provided with each of the wiring layers.

Further, the circuit element of the present invention includes that the dummy patterns are provided in almost all of domains on which the conductive patterns are not formed.

Further, the circuit element of the present invention includes that the dummy patterns, all of which are rectangular and have an identical size, are disposed at even intervals.

Further, the circuit element of the present invention includes that the dummy patterns formed on each two adjacent ones of the wiring layers are thermally connected to one another with a connection part which penetrates the insulation layer therebetween.

Further, the circuit element of the present invention includes that the connection part is formed by a first connection part which is extended upward in a convex shape from the wiring layer located below the insulation layer and by a second connection part which is extended downward in a convex shape from the wiring layer located above the insulation layer; and the first connection part and the second connection part make a contact in the middle of the insulation layer in the thickness-wise direction.

Further, the circuit element of the present invention includes that the first connection part is formed by performing an etching process on one slice of copper foil; and the second connection part is formed by a plating film.

Further, the circuit element of the present invention includes that the first wiring layer and the second wiring layer are formed on a front face of a circuit substrate, the front face which has been provided with an insulation treatment.

According to the circuit device of the present invention, a dummy pattern through which an electric signal does not passes is provided, whereby heat is conducted through the dummy pattern, and heat generated in the inside can be suitably discharged to the outside. Dummy patterns, which are provided on the respective layers of multi-layered wiring, are connected through a connection part, and thereby an enhancement of the heat dissipation property can be achieved.

DESCRIPTION OF THE PREFERRED EMBODIMENTS

First Embodiment

Figure 1A:
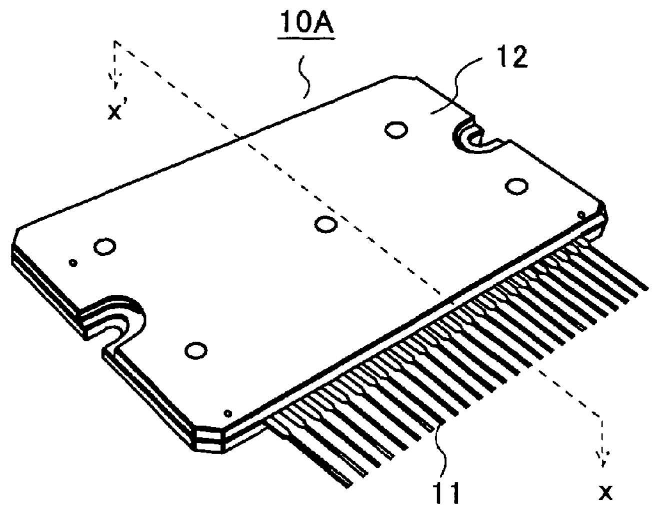
FIGS. 1A, 1B and 1C are respectively a perspective view, a cross-sectional view and another cross-sectional view of a circuit device according to an embodiment of the present invention.
Figure 1B:
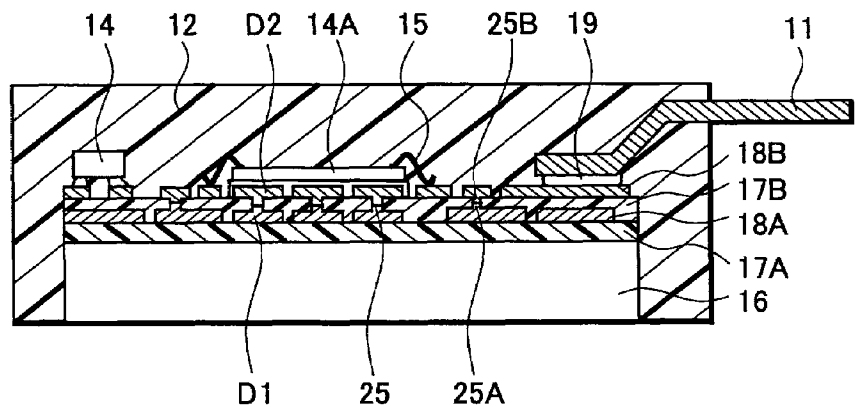
Figure 1C:
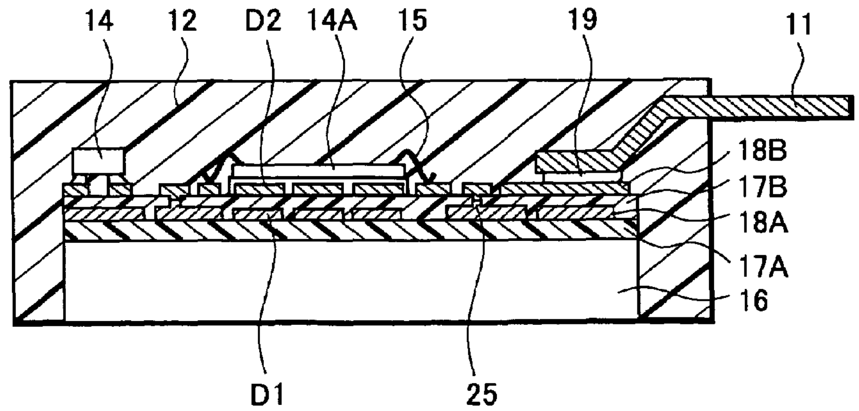

In a first embodiment, a hybrid integrated circuit device such as one shown in the drawings such as FIGS. 1A to 1C is described as an example of a circuit device. However, the present embodiment described below is applicable to other kinds of circuit devices.

With reference to FIGS. 1A to 1C, a configuration of a hybrid integrated circuit device 10 according to the embodiment of the present invention is described. FIG. 1A is a perspective view of the hybrid integrated circuit device 10, while FIG. 1B is a cross-sectional view taken along the line X-X' in FIG. 1A.

In the hybrid integrated circuit device 10, with reference to FIGS. 1A and 1B, an electric circuit including wiring layers 18 and a circuit device 14 is formed on a front face of a circuit substrate 16 which serves as a supporting substrate. Further, the electric circuit formed on the front face of the circuit substrate 16 is sealed with sealing resin 12. Leads 11 are fixed to an uppermost layer of the wiring layers 18 on the periphery of the circuit substrate 16, and ends of the leads 11 are routen out of the sealing resin 12. In the present embodiment, the wiring layers are provided in the form of a multi-layered wiring structure, which is formed as a two-layered wiring structure including a first wiring layer 18A and a second wiring layer 18B in the present case. The wiring layers 18A and 18B are provided with an insulation layer interposed therebetween. Meanwhile, a first dummy pattern D1 is formed on the first wiring layer, while a second dummy pattern D2 is formed on the second wiring layer. The first dummy pattern D1 and the second dummy pattern D2 are thermally connected through a connection part 25. A semiconductor element 14A is mounted over multiple second dummy patterns D2. The hybrid integrated circuit device 10 having such a configuration is described below in detail.

The circuit substrate 16 is suitably a substrate made of metal, ceramic or the like in view of a heat dissipation property. For materials of the circuit substrate 16, Al, Cu, Fe, and the like can be adopted as metal materials, while $Al2O3$ and AlN can be used as ceramic materials. Other than these materials, a material which is superior in terms of mechanical strength and a heat dissipation property can be used for the circuit substrate 16.

Moreover, it is also possible to adopt a flexible substrate, a print substrate, a glass epoxy substrate or the like as the circuit substrate 16.

In the present embodiment, an insulation layer 17 is formed on a front face of the circuit substrate 16 which is made of aluminum, and the wiring layers 18A and 18B are formed on a surface of the insulation layer 17. Meanwhile, it is also possible to adopt metal consisting principally of copper as the material of the circuit substrate 16. Since the copper is a material which is superior in heat conductivity, its use can enhance the heat dissipation property of the entire device. When use of Al is considered, it is relevant to form an aluminum oxide at least on the front face thereof, in view of its mechanical strength.

A first insulation layer 17A is so formed on the front face of the circuit substrate 16 as to cover the substantially entire front face thereof. For a material of the first insulation layer 17A, a resin where filler is filled can be adopted. Here, as the filler, it is possible to adopt, for example, an aluminum compound, a calcium compound, a potassium compound, a magnesium compound, or a silicon compound. The first insulation layer 17A contains a larger quantity of filler than another insulation layers, in order to enhance the heat insulation property of the entire device. The weight-filling ratio of the filler is, for example, in a range of 60% to 80%. Furthermore, an enhanced heat dissipation property can also be achieved by mixing filler into the first insulation layer 17A, the filler being a substance of large size with a diameter not less than 50 μm. While the thickness of the first insulation layer 17A can vary depending on a required breakdown voltage, it is favorable to be approximately from 50 μm to several hundred micrometers.

The first wiring layer 18A is made of metal such as copper, and is patterned on the surface of the first insulation layer 17A. The first wiring layer 18A is electrically connected to the second wiring layer 18B of the upper layer, and has a function mainly to route patterns around.

A second insulation layer 17B is formed above the front face of the circuit substrate 16 in a manner that it covers the first wiring layer 18A. The connection part 25 is formed through the second insulation layer 17B, whereby the first wiring layer 18A and the second wiring layer 18B are electrically connected. Therefore, a smaller quantity of filler may be mixed into the second insulation layer 17B compared with the first insulation layer 17A in order to make it easier to form the connection part 25. This means the content of the filler is small. For the same reason, the average diameter of filler contained in the second insulation layer 17B may be smaller than that of filler contained in the first insulation layer 17A.

The second wiring layer 18B is formed on the surface of the second insulation layer 17B. The second wiring layer 18B includes a land on which a circuit element 14 is mounted, a pad which is connected to an electrode on a circuit element, a wiring part for establishing an electrical connection with the pad, and a pad or the like where a lead 11 is fixed. In addition, the second wiring layer 18B and the first wiring layer 18A can be formed to cross one another in a plane. Accordingly, even if the semiconductor element 14A includes multiple electrodes, the multi-layered structure of the present application makes it possible to realize a cross-over configuration, and hence free routing of patterns. The second wiring layer 18B and the above mentioned first wiring layer 18A are connected at desired places through the connection parts 25. It is apparently possible to increase the number of layers to three, four, six or more depending on the number of electrodes for a semiconductor element, the packaging density of elements, and the like.

The connection part 25 is a part which is penetrating through the second insulation layer 17B and where the first wiring layer 18A and the second wiring layer 18B are electrically connected. In the present embodiment, the connection part 25 is formed by a first connection part 25A which is extended continuously from the first wiring layer 18A and by a second connection part 25B which is extended continuously from the second wiring layer 18B.

The circuit element 14 is fixed onto the second wiring layer 18B; and the circuit element 14 and the wiring layers 18A and 18B form an electric circuit. As the circuit element 14, an active element such as a transistor, a diode, an IC or a system LSI, or a passive element such as a capacitor or a resistance is adopted. An element which generates a large quantity of heat, such as a power-type semiconductor element, may be fixed to the circuit substrate 16 through a heat sink made of metal. Here, while the semiconductor element 14A is a face-up type and hence is electrically connected to the second wiring layer 18B through a metal thin wire 15, it can be mounted face-down.

The semiconductor element 14A is a semiconductor element whose surface has several tens to several hundred of pads. An element so-called a system LSI can also be used as the semiconductor element 14A. Here, the system LSI is a large-scale element which includes an analog arithmetic circuit, a digital arithmetic circuit, a storage part or the like, and which can achieve a system function in one LSI. Therefore, the system LSI operates while creating a larger quantity of heat compared with a conventional LSI.

Further, when the back face of the semiconductor element 14A is connected to ground potential, the back face of the semiconductor element 14A is fixed using a brazing material, a conductive paste, or the like. When the back face of the semiconductor element 14A is floating, the back face of the semiconductor element 14A is fixed using an insulative paste. When the semiconductor element 14A is mounted facedown, it is mounted by way of a bump electrode made of solder or the like.

As the semiconductor element 14A, a power-type transistor which controls a large current and which is, for example, a Power MOS, a GTBT, an IGBT, a thyrister or the like can be adopted. A power-type IC can also be adopted as the semiconductor element 14A.

In recent years, since a chip has become smaller, thinner and more highly functional, when viewing an entire device or an entire module as shown in the drawings such as FIGS. 1A to 1C, the quantity of heat produced thereby has been increasing every year. One example is a chip such as a CPU which controls a computer. Meanwhile, an Si chip itself has become smaller and thinner. Hence, the quantity of heat produced per unit area has been increasing every year. In addition, since a larger number of these IC's and transistors are mounted in such a device, the quantity of heat produced by the entire device has been incomparably increasing.

The lead 11 is fixed to the second wiring layer 18B on the periphery of the circuit substrate 16, and has a function of inputting from and outputting to the outside, for example. Here, while a multiple number of the leads 11 are provided along one side, they can be provided along two opposed sides or four sides. Bonding between the lead 11 and a pattern is made using a brazing material such as solder.

The sealing resin 12 is formed by means of a transfer mold using a thermosetting resin, or of an injection mold using a thermoplastic resin. Here, the sealing resin 12 is formed to seal an electric circuit which is formed on the circuit substrate 16 and the front face thereof, while the back face thereof is exposed from the sealing resin 12. Still further, as a sealing method other than the mold, a known method such as, for example, sealing with potting, sealing with a case material, or the like can be adopted. In FIG. 1B, the back face of the circuit substrate 16 is exposed from the sealing resin 12 in order to suitably discharge the heat generated by the circuit element 14 which is placed on the front face of the circuit substrate 16. For enhancing the moisture resistance of the entire device, the entire surface including the back face of the circuit substrate 16 can be sealed with the sealing resin 12.

In the present embodiment, a dummy pattern is formed on each wiring layer, the semiconductor element 14A is fixed onto the dummy pattern, and thereby enhanced heat dissipation is achieved. Further, the dummy patterns formed on the respective wiring layers are connected through the connection part 25, hence achieving further enhanced heat dissipation. Moreover, a dummy pattern is made independent of an electric circuit, and thus it becomes possible to keep the semiconductor element 14A to be free of an electric noise. A dummy pattern of the present embodiment is described below in detail.

In the present embodiment, each of the wiring layers 18A and 18B is formed by a conductive pattern which is electrically connected to a built-in electric circuit and through which an electric signal passes, and a dummy pattern through which an electric signal does not pass. Here, two types of dummy patters can be taken into account. A first type of dummy patterns is one where a pattern is formed to be physically separated from a conductive pattern so that the pattern is not electrically continuous with the conductive pattern. Another type of dummy patterns is one where, while a pattern is electrically continuous with a conductive pattern through which an electric signal passes, the pattern is one through which an electric signal does not pass. The conductive pattern through which an electric signal passes is connected at its both ends to the circuit element 14, the lead 11, or the like. By contrast, the dummy pattern here has one end which is extended to a conductive pattern, but the other end which is electrically terminated and is not connected to any other circuit elements or the like.

The first dummy pattern D1 is a pattern, which is formed by a part of the first wiring layer 18A. Multiple first dummy patterns D1 are formed below the semiconductor element 14A, which is an LSI element. The first dummy patterns D1, whose sizes are roughly equal, are formed at equal intervals. To be more specific, the first dummy patterns D1, each being a square having a side of about 300 μm, for example, may be disposed with about 100 μm spacing between adjacent ones thereof. That is, in a domain below the semiconductor element 14A, there is a part where a pattern configuring an electric circuit, which is electrically connected to the circuit element 14, is not formed. On that part, the first dummy pattern D1 is formed. As a result of this, it becomes possible to effectively conduct the heat generated in the semiconductor element 14A to the circuit substrate 16 though the dummy pattern D1.

The second dummy pattern D2 is a pattern, which is formed by a part of the second wiring layer 18B, and the detail is similar to that for the above described first dummy pattern D1. The first dummy pattern D1 and the second dummy pattern D2 are connected to each other though the connection part 25 which is formed by causing it to penetrate through the second insulation layer 17B. The connection part 25 is formed by the first connection part 25A, which is protruded upward from the first dummy pattern D1 located in the lower layer, and the second connection part 25B, which is protruded downward from the upper second insulation layer 17B located in the upper layer. In addition, the first connection part 25A and the second connection part 25B are making a contact in the middle of the thickness of the second insulation layer 17B. As a result of this, it becomes possible to enhance the reliability of the connection part 25 against thermal stress.

When the back face of the semiconductor element 14A is a floating without being electrically connected to the outside, it is more suitable for the first dummy pattern D1 and the second dummy pattern D2 to be connected to ground potential. This is because, when considering the case where both of the dummy patterns are electrically independent, the electric potentials of both of the dummy patterns change while they are in use, whereby there is a risk that a malfunction possibly occurs in the semiconductor element 14A.

Meanwhile, in the drawing, while the first dummy pattern D1 and the second dummy pattern D2 are located below the semiconductor element 14A, these dummy patterns can be formed below a part of the semiconductor element 14A. On the front face of the semiconductor element 14A, there are portions (hot spots) where high heat quantities locally occur. To be more specific, a large quantity of heat is often generated around a portion where a clock is inputted from the outside. Accordingly, the dummy pattern of the present embodiment is placed in a domain, which corresponds to a position below such a hot spot, and thereby heat discharging is enhanced. Furthermore, it is also possible to form the dummy pattern in a domain other than below the semiconductor element 14A.

In the respective wiring layers 18A and 18B, it is suitable to form the dummy pattern of the present embodiment so as to fill in a part where a conductive pattern configuring an electric circuit is not provided. As a result of this, on the entire regions of the respective wiring layers 18A and 18B, a pattern, which is made of metal with high thermal conductivity, can be disposed, and thereby the heat dissipation property of the entire device can be greatly enhanced. Further, it is also possible to dispose a dummy pattern in a domain where the circuit element 14 which is accompanied by heat radiation in operation is provided, and thereafter to dispose at a remaining domain a conductive pattern through which an electric signal passes. As a result of this, a layout of the patterns where a heat dissipation property is taken into account at the maximum can be achieved.

In FIG. 1C, dummy patterns formed on the respective wiring layers 18A and 18B are not connected to the connection part 25. Even when the dummy patterns are disposed in such a configuration, it is still possible to securely enhance the heat dissipation property of the entire device.

Figure 2A:
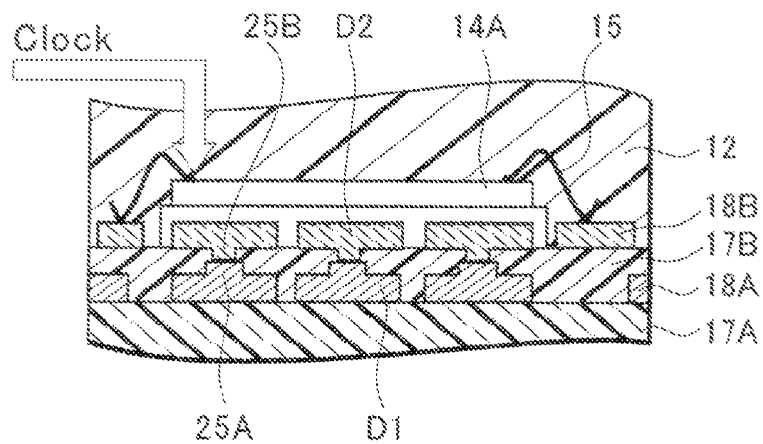
FIGS. 2A, 2B and 2C are respectively a cross-sectional view, another cross-sectional view and a perspective view of the circuit device according to the embodiment of the present invention.
Figure 2B:
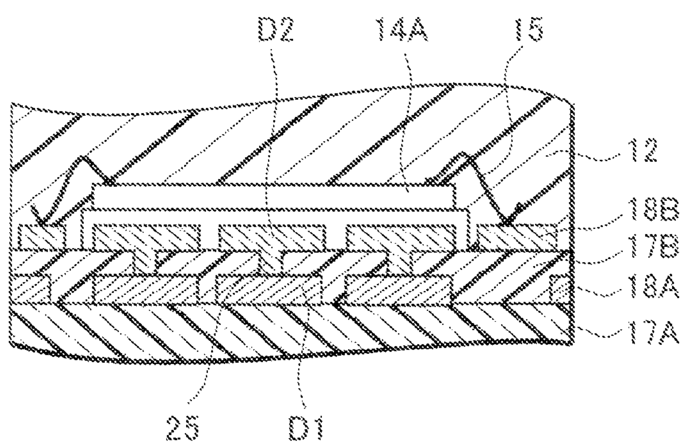

With reference to FIGS. 2A and 2B, the connection part 25 through which the respective wiring layers 18A and 18B are connected to each other is described in detail.

In FIG. 2A, the first wiring layer 18A is provided with the first connection part 25A which is protruded upward in a continuous manner. Meanwhile, the second wiring layer 18B is provided with the second connection part 25B which is protruded downward in a continuous manner. In addition, the first connection part 25A and the second connection part 25B are making a contact in the middle of the thickness of the second insulation layer 17B, whereby the connection part 25 is formed. Making a contact in the above manner between the above two connection parts in the middle of the second insulation layer 17B makes it possible to increase connection strength. Therefore, even in such as a case as the present embodiment where the dummy pattern is passed through by a high quantity of heat, it is possible to secure the connection reliability of the connection part 25 against thermal stress.

In FIG. 2B, the connection part 25, which is extended downward in a continuous manner from the second wiring layer 18B, is formed. Even for the connection part 25 having a configuration shown in the drawing, it is possible to thermally connect the dummy patterns formed on the respective wiring layers 18A and 18B.

Figure 2C:
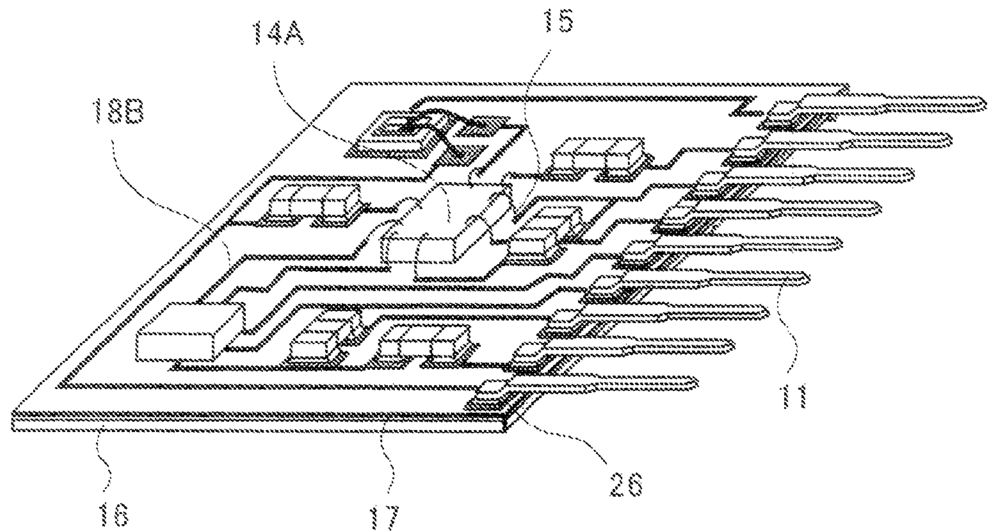

With reference to a perspective view in FIG. 2C, an example for a specific shape of the second wiring layer 18B, which is formed on the front face of the circuit substrate 16, is described. In the drawing, a resin, which is used to seal the entire device, is omitted.

In the drawing, the second wiring layer 18B includes a bonding pad part where the circuit element 14 is mounted, a pad 26 to which the leads 11 are fixed, and the like. On the periphery of the semiconductor element 14A, a number of pads to which metal thin wires 15 are wire-bonded are formed. When a semiconductor element 14A including a number of bonding pads is placed, since a pattern in a single layer using the second wiring layer 18B alone has a limit in wiring density, there is the possibility of risk that a sufficient routing is not possible. In the present embodiment, a multi-layered wiring structure is fabricated on the front face of the circuit substrate 16, and thereby routing of a complex pattern is achieved.

Figure 3A:
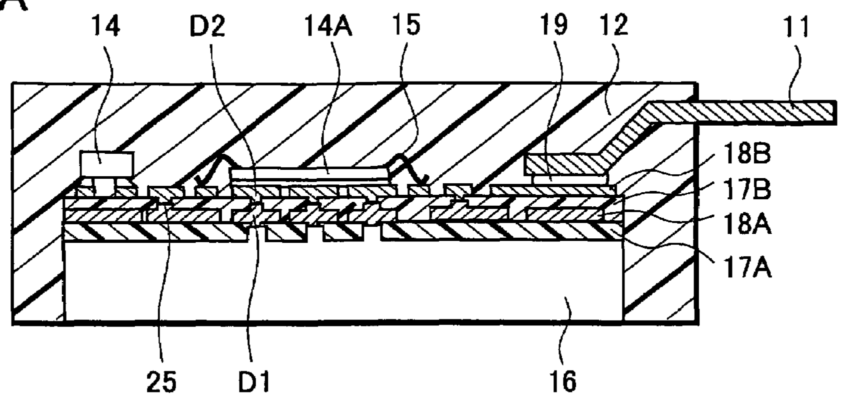
FIGS. 3A, 3B and 3C are cross-sectional views showing the circuit device according to the embodiment of the present invention.
Figure 3B:
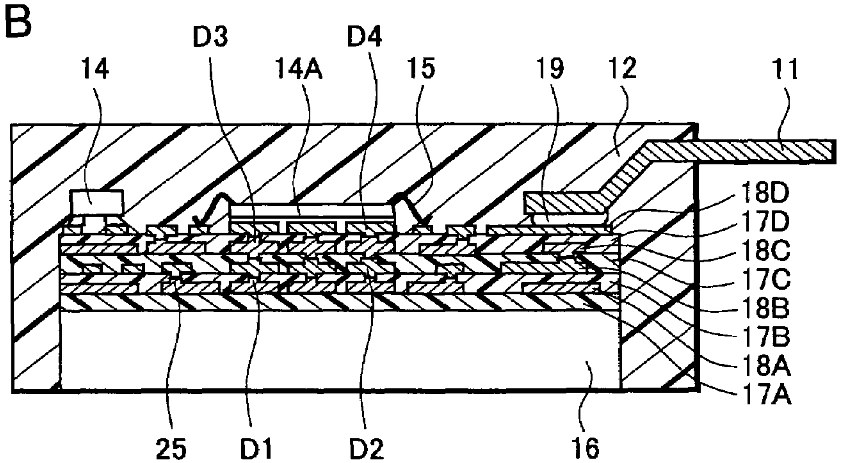
Figure 3C:
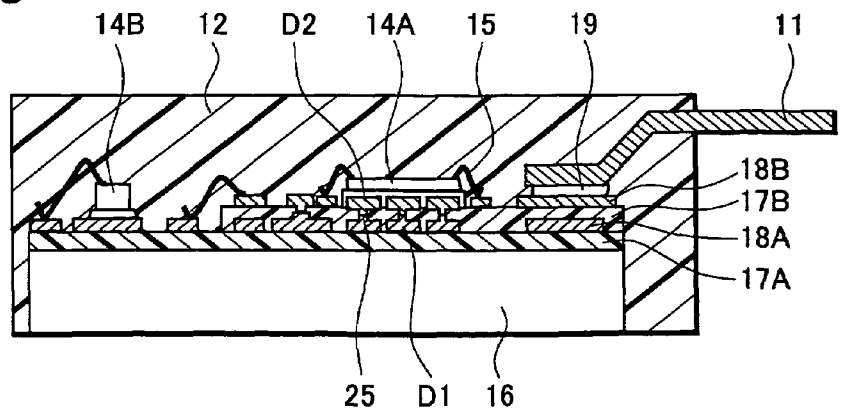

With reference to FIGS. 3A, 3B and 3C, circuit devices of other embodiments are described.

First, in FIG. 3A, a first dummy pattern D1 is thermally connected to a circuit substrate 16 through a connection part 25. Therefore, it is possible to cause heat generated by a semiconductor element 14A to be quickly conducted to the circuit substrate 16, thereby enhancing a heat dissipation property. Here, dummy patterns provided to the respective wiring layers are connected in the direction of thickness through the connection part 25. In addition, the first dummy pattern D1, which is the lowermost layer, is connected to the circuit substrate 16 through the connection part 25. This brings about an advantage that the heat is favorably conducted to the circuit substrate 16 through the dummy patterns formed on the respective layers, even when the multi-layered wiring structure is formed.

In FIG. 3B, a wiring consists of four layers, and on each wiring layer there is provided a group of dummy patterns, which is divided into a plurality of dummy patterns. A first dummy pattern D1 is formed on a first wiring layer 18A. Meanwhile, a second dummy pattern D2 is formed on a second wiring layer 18B. Furthermore, a third dummy pattern D3 is formed on a third wiring layer 18C. Moreover, a fourth dummy pattern D4 is formed on a fourth wiring layer 18D. While the dummy patterns formed on the respective layers are electrically connected through the connection parts 25, they are electrically independent of electric circuits configured within a device.

Here, the dummy patterns formed on the respective wiring layers are disposed right beneath a domain where the semiconductor element 14A is mounted, whereby a distance required for the heat conduction becomes shortened, hence enhancing the heat dissipation property.

In FIG. 3C, a multi-layered wiring structure is formed on the front face of the circuit substrate 16 in a domain where the semiconductor element 14A having a number of pads is placed, while a single-layered wiring structure is formed on the front face of the circuit substrate 16 in a domain where a circuit element 14B is fixed.

In addition, a second conductive pattern 18B in a multi-layered portion is electrically connected to a first conductive pattern 18A in a single-layered portion, through a metal thin wire 15.

The circuit element 14B is, for example, a power-type semiconductor element, and a switching element which generates a high quantity of heat. A heat dissipation effect gained in an area of the circuit substrate 16 where the single-layered wiring structure including the first conductive pattern 18A has been formed is higher than that gained in another area. Hence, with respect to a discrete transistor, which generates a high quantity of heat, such as one represented by the circuit element 14B, it is suitable to directly fix it to the first conductive pattern 18A forming the single-layered wiring.

Here, the semiconductor element 14A is an element which radiates a high quantity of heat in operation. Therefore, the semiconductor element 14A is fixed onto the second dummy pattern D2, and thereby the heat dissipation property is enhanced. A specific path for the heat dissipation is: starting from the second dummy pattern D2, passing through the first dummy pattern D1, the first insulation layer 17A and the circuit substrate 16 in this order, and ending at the outside. In the present embodiment, the first dummy pattern D1 is formed right beneath the second dummy pattern D2. Therefore, the heat generated can be discharged to the outside at a shortest distance, and thereby the heat dissipation property can be enhanced. The first dummy pattern D1 and the second dummy pattern D2 are thermally connected. It is, thus, possible to quickly discharge the heat generated by the semiconductor element 14A to the outside. Furthermore, the first dummy pattern D1 and the second dummy pattern D2 are electrically independent of electric circuits. Accordingly, the semiconductor element 14A is free of an influence due to an electric noise, whereby a highly reliable circuit device can be achieved.

Next, a manufacturing method of a circuit device is described by way of taking a hybrid integrated circuit device as an example thereof. However, the manufacturing method of the present embodiment described below is applicable to a manufacturing method of other kind of circuit device.

Figure 4A:
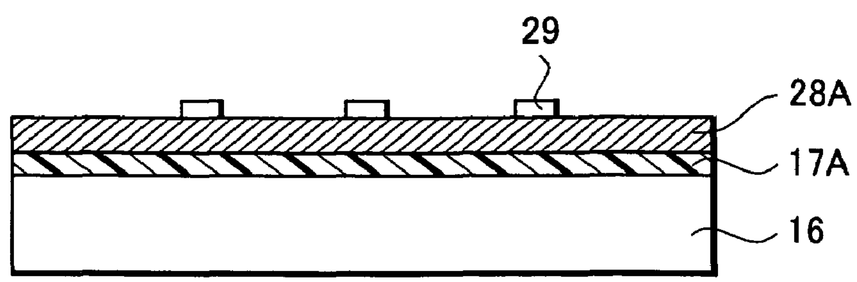
FIGS. 4A, 4B and 4C are cross-sectional views showing a manufacturing method of the circuit device according to the embodiment of the present invention.

In FIG. 4A, first, a first insulation layer 17A is applied on a front face of a circuit substrate 16, and a first conductive film 28A is laminated thereon. As the circuit substrate 16, it is suitable to adopt a metallic plate with a thickness of approximately 1.5 mm. In addition, for the first conductive film 28A, a material consisting principally of copper, Fe—Ni, or Al can be adopted. The first conductive film 28A is required to have a thickness which is not less than a sum of the thickness of a wiring layer 18A to be formed, and the height of a first connection part 25A. To be more precise, the first conductive film 28A has a thickness, for example, in a range of approximately 20 μm to 150 μm. A resist 29 covers a surface of the fist conductive film 28A in a domain where the first connection part 25A is supposed to be formed. Etching is performed while the resist 29 is left covering as described above. For the first insulation layer 17A, it is possible to adopt a material where inorganic filler is mixed into an insulative resin such as an epoxy resin. Here, the inorganic filler indicates SiO2, Al2O3, SiC, AlN or the like.

Figure 4B:
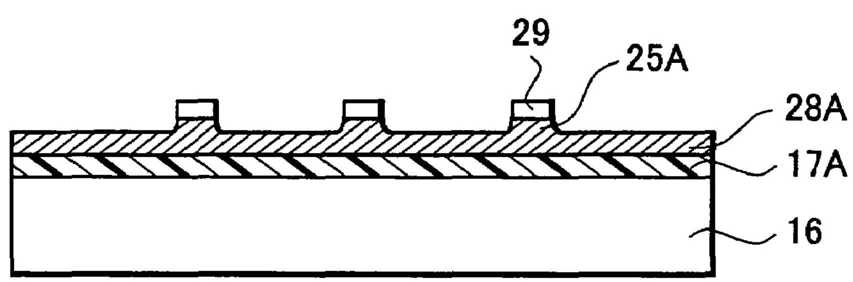
Figure 4C:
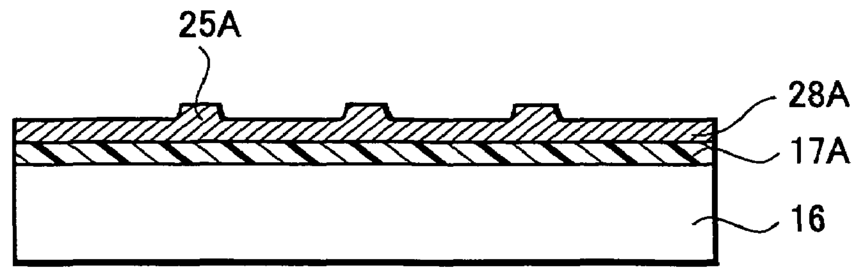

In FIG. 4B, a cross-section for the state after the etching has been performed is shown. Here, a domain covered with the resist 29 is protruded with a convex shape. The first connection part 25A is formed with this convex-shaped protruded portion. A portion of the first conductive film 28A where the etching has been performed with its surface exposed is uniformly thinner. After the present step is completed, the resist 29 is peeled off. Here, the height of the protrusion for the first connection part 25A is adjusted to be approximately several tens of micrometers. In FIG. 4C, the first connection part 25A where the resist 29 is peeled off is shown.

Figure 5A:
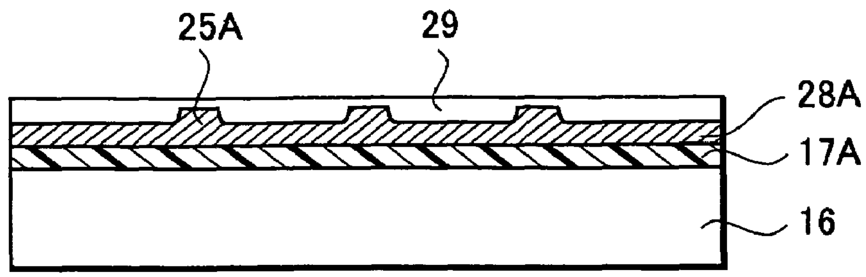
FIGS. 5A, 5B, 5C and 5D are cross-sectional views showing the manufacturing method of the circuit device according to the embodiment of the present invention.
Figure 5B:
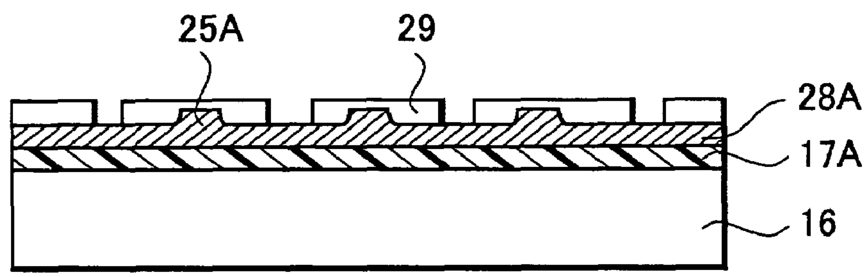
Figure 5C:
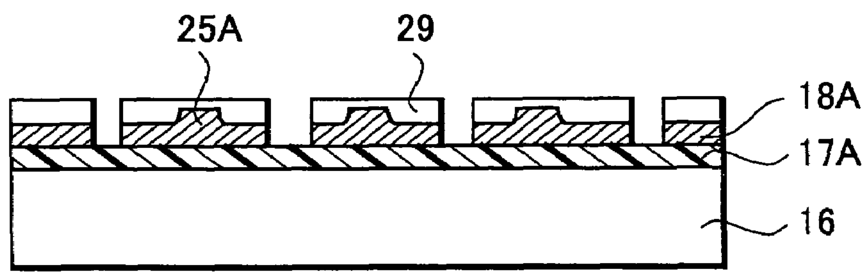

In FIGS. 5A, 5B and 5C, the first conductive film 28A including the top face of the first connection part 25A is covered with the resist 29. Furthermore, the resist 29 is selectively formed. The first wiring layer 18A is patterned by performing etching through the resist 29. After the etching on the first wiring layer 18A is completed, the resist 29 is peeled off.

Figure 5D:
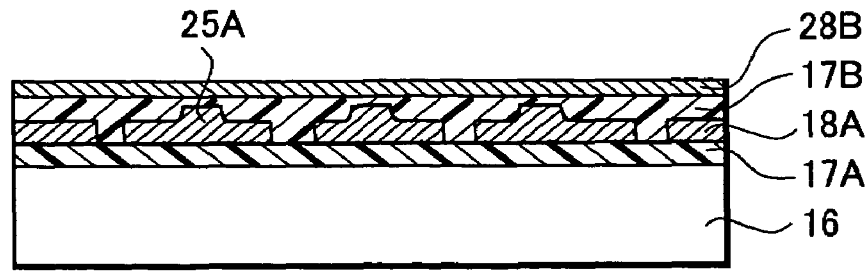

In FIG. 5D, a second conductive film 28B is laminated above the first wiring layer 18A in a manner that a second insulation layer 17B, which covers the first wiring layer 18A, is interposed therebetween. For achieving this configuration, the following three methods can be considered. The first method is that the second insulation layer 17B is formed so as to cover a first wiring layer 18A, and thereafter the second conductive film 28B formed of a plating film is formed on the surface of the second insulation layer 17B. The second method is that the second insulation layer 17B is formed, and thereafter the second conductive film 28B formed of a rolled copper foil or the like is crimped to a surface of the second insulation layer 17B. This second method increases the bonding strength between the second insulation layer 17B and the second conductive film 28B. The third method is that the second conductive film 28B to the back face of which a second insulation layer 17B is bonded is laminated to cover a first wiring layer 18A. This third method, too, increases the bonding strength between the second insulation layer 17B and the second conductive film 28B.

Furthermore, the first connection part 25A has a tapered-shape in the side face view, which leads to a merit that embedding of the first connection part 25A into the second insulation layer 17B becomes easier.

Figure 6A:
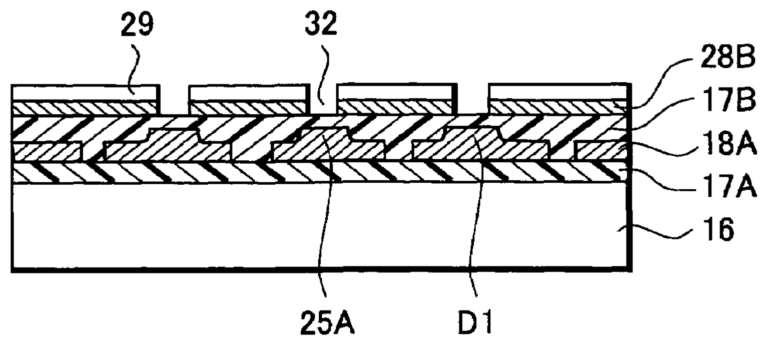
FIGS. 6A, 6B and 6C are respectively a cross-sectional view, another cross-sectional view and a plan view showing the manufacturing method of the circuit device according to the embodiment of the present invention.
Figure 6B:
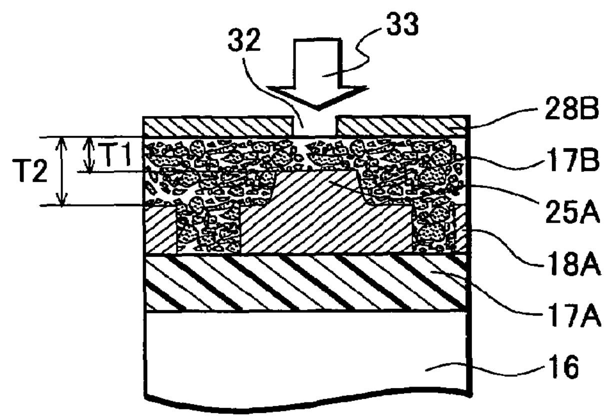
Figure 6C:
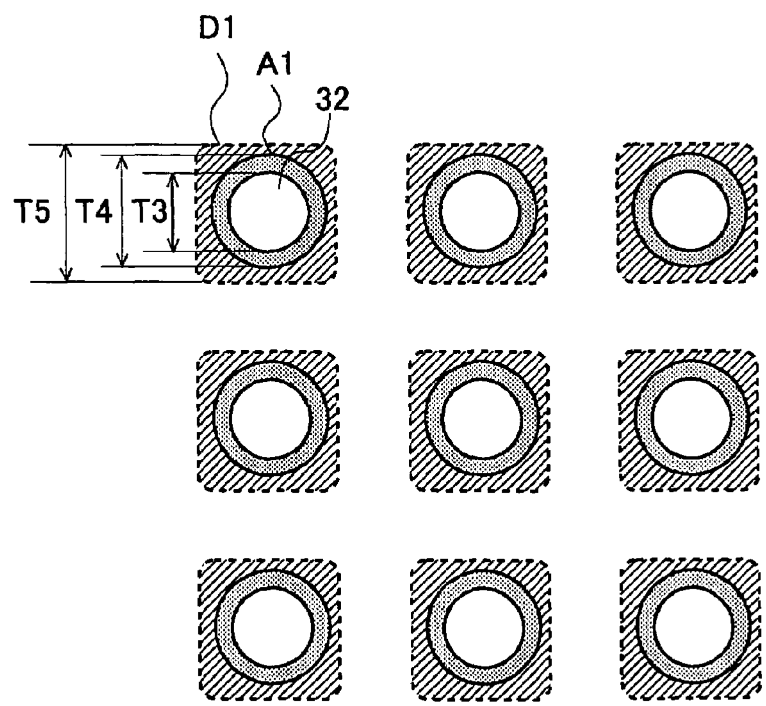

In FIGS. 6A, 6B, and 6C, portions of the second insulation layer 17B and the second conductive film 28B, which correspond to those where a connection part 25 is formed, are removed to form a through-hole 32. First, in FIG. 6A, a portion of the second conductive film 28B, which corresponds to a region where the through-hole 32 is supposed to be formed, is removed. To be more precise, the resist 29 is formed on a surface of the second conductive film 28B, except the region where the through-hole 32 is supposed to be formed, and then etching is performed. After performing these operations, the second conductive film 28B is partially removed, and thereby the though-hole 32 is formed. Further, a portion of the second insulation layer 17B below that is removed, and the through-hole 32 is, thus, deepened. Then, a front face of the first wiring layer 18A is exposed to a bottom face of the through-hole 32. Here, a top face of the first connection part 25A provided to the first wiring layer 18A is exposed to the bottom face of the through-hole 32.

A way of forming the through-hole 32 is described further in detail with reference to FIG. 6B. In the present embodiment, the embedding of the first connection part 25A causes the second insulation layer 17B located below the through-hole 32 to become thinner. Subsequently, a thinned portion of the second insulation layer 17B is removed using a laser or the like so that the first connection part 25A is exposed to a bottom face of the through-hole 32. In a large part of the region, a thickness T2 of the second insulation layer 17B is, for example, approximately 50 μm. Meanwhile, a thickness T1 of a portion of the second insulation layer 17B, which corresponds to a region below the through-hole 32, is thinner and is in a range of approximately 10 μm to 25 μm, for example.

Therefore, when it is assumed that the though-holes 32 having the same aspect ratio are formed using a laser, it is possible, in the present embodiment, to form the through-hole 32 with a small diameter. With the above condition, it is possible to make the diameter of the through-hole 32 to approximately a half, whereby the area occupied by the through-hole 32 can be made into approximately a quarter. This contributes to a reduction in size for the entire device. Furthermore, since inorganic filler is mixed into the second insulation layer 17B to secure the heat dissipation property, it becomes somewhat difficult to form the through-hole 32 using a laser. In order to make it possible to form the through-hole 32 even under such a condition as well, it is meaningful to thin a portion of the second insulation layer 17B where the through-hole 32 is formed.

The above-described steps for forming the through-hole 32 are described in detail with reference to FIG. 6C. The drawing shows a positional relationship in a plane between the first dummy pattern D1 which is formed on the first wiring layer 18A, and the through-holes 32. Here, the first dummy patterns D1 each of which patterns has a square shape are disposed in matrix at equal intervals. Each of the dummy patterns D1 is a square with each of its sides having a length T3 of 300 μm, for example. Each two adjacent ones of the dummy patterns D1 are disposed at a distance of approximately 100 μm apart from one another.

An irradiation domain A1 of a laser is a circular domain, and its diameter is about 250 μm. Within the irradiation domain A1, the through-hole 32 is located. The through-hole 32 is also circular, and the diameter is approximately 150 μm. That is, in the present embodiment, by using the second conductive film 28B, which includes the through-hole 32 slightly smaller than the irradiation domain A1, as a mask, the removing process using a laser is provided. This type of process is referred to as a conformal via process. In addition, the first dummy pattern D1 of the present embodiment is a rectangular which is slightly larger than the irradiation domain A1 for a laser.

Figure 7A:
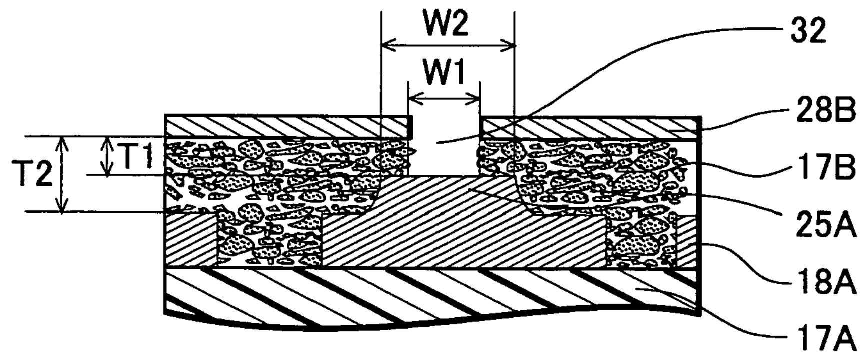
FIGS. 7A, 7B and 7C are cross-sectional views showing the manufacturing method of the circuit device according to the embodiment of the present invention.

FIG. 7A shows a cross-section after the through-hole 32 is formed according to the above method. A top face of the first connection part 25A is exposed from a bottom face of the through-hole 32. Filler, which is mixed into the second insulation layer 17B, is exposed from the sidewall of the through-hole 32 which is formed using a laser. In order to enhance a heat dissipation property, filler having a large width is mixed into the second insulation layer 17B of the present embodiment. Accordingly, the surface of the sidewall of the through-hole 32 is bumpy. A typical one for the above filler is Al2O3, AlN, or the like. When there are residuals in the bottom face of the through-hole 32 due to the above laser treatment, these residuals are washed out.

The first connection part 25A is formed so that its planar size is larger than that of the through-hole which is formed above the first connection part 25A. That is, since the planar shapes of the through-hole 32 and the first connection part 25A are circular, the diameter of the first connection part 25A is larger than that of the through-hole 32. For example, when a diameter W1 of the through-hole 32 is approximately 100 μm, the first connection part 25A is formed to have its diameter W2 to be in a range of 150 μm to 200 μm. When the diameter W1 of the through-hole 32 is in a range of 30 μm to 50 μm, the diameter W2 of the first connection part 25A is adjusted to be in a range of 50 μm to 70 μm. In this way, the planar size of the first connection part 25A is set to be larger than that of the through-hole 32 so that even when the through-hole 32 is formed at a displaced position, it is still possible to locate the through-hole 32 above the first connection part 25A. Therefore, it is possible to prevent the connection reliability from being lost due to the above-mentioned displaced position. Incidentally, as the planar shape of the first connection part 25A, a shape other than a circular can also be adopted.

Figure 7B:
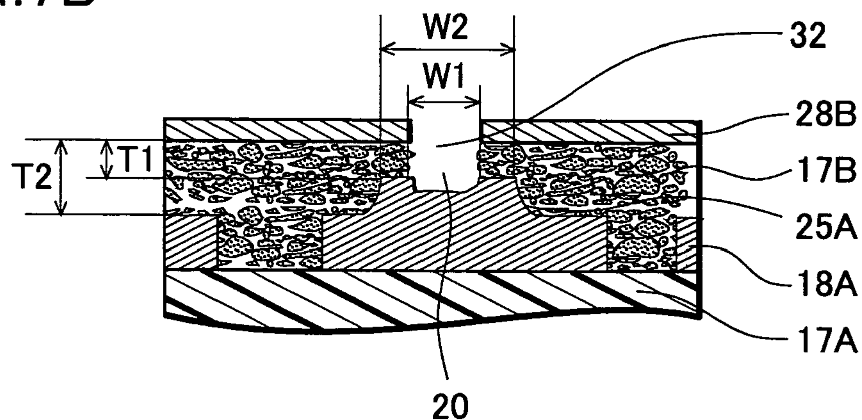

In FIG. 7B, a laser is irradiated on a top face of the first connection part 25A, and thereby a concave part 20 is provided. The formation of this concave part 20 can be achieved by performing a continuous laser irradiation, after the top face of the first connection part 25A is exposed from the bottom of the through-hole 32. Furthermore, in the present embodiment, the above removing treatment using a laser can be performed with a carbon dioxide laser or YAG laser. For the formation of the concave part 20, use of the YAG laser is more suitable. Since a laser with a waveband of the YAG laser has a small reflection coefficient on copper which is the material of the first connection part 25A, the concave part 20 can be easily formed.

The providing of the concave part 20 increases the bonding strength between a plating film, which is formed on an inner wall of the through-hole 32 in a later process, and the first connection part 25A. Therefore, it is possible to enhance the connection reliability of the connection part 25 which is used for connecting the respective wiring layers. The plating film, which is embedded into the concave part 20, is highly resistant to cracking inform the lateral direction.

Figure 7C:
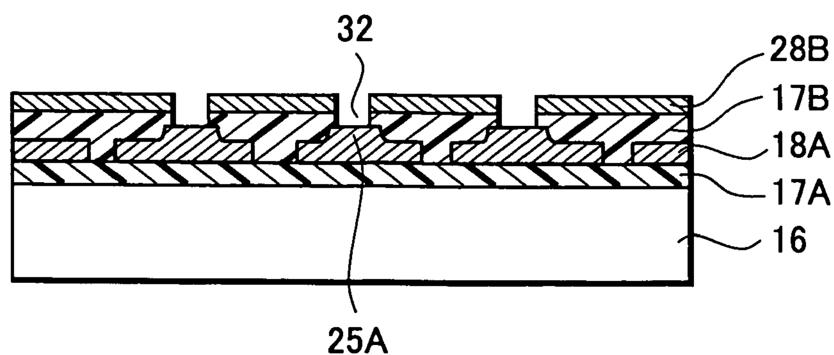

In FIG. 7C, after completing the above-described processes, the top face of the first connection part 25A is exposed from the bottom face of each through-hole 32. In the above description, while the through-hole 32 is formed after the second conductive film 28B is laminated, it is also possible to first form the through-hole 32 and then to laminate the second conductive film 28B.

Next, to perform a plating process in a following process, a zincate process is performed as a pretreatment. Here, what is the zincate process is that an electroless plating process is performed using alkaline solution, which contains Zn ion, so as to facilitate a plating process.

With reference to FIGS. 8A, 8B, 8C, 9A and 9B, there is described a process in which the plating film is formed on the through-hole 32, and thereby a second connection part 25B is formed, and the first wiring layer 18A and the second conductive film 28B are caused to be conducted. For the formation of this plating film, the following two methods are considered. The first method is that a plating film is formed with electroless plating, and thereafter a plating film is again deposited with electrolytic plating. The second method is that a plating film is deposited with an electrolytic plating process alone.

Figure 8A:
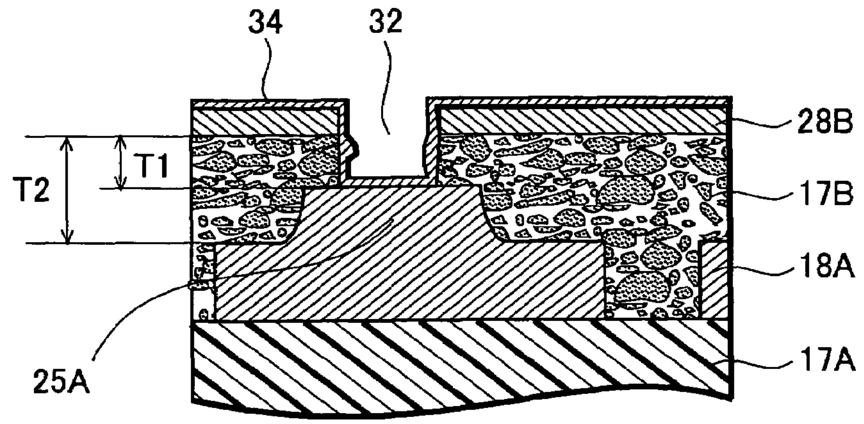
FIGS. 8A, 8B and 8C are cross-sectional views showing the manufacturing method of the circuit device according to the embodiment of the present invention.
Figure 8B:
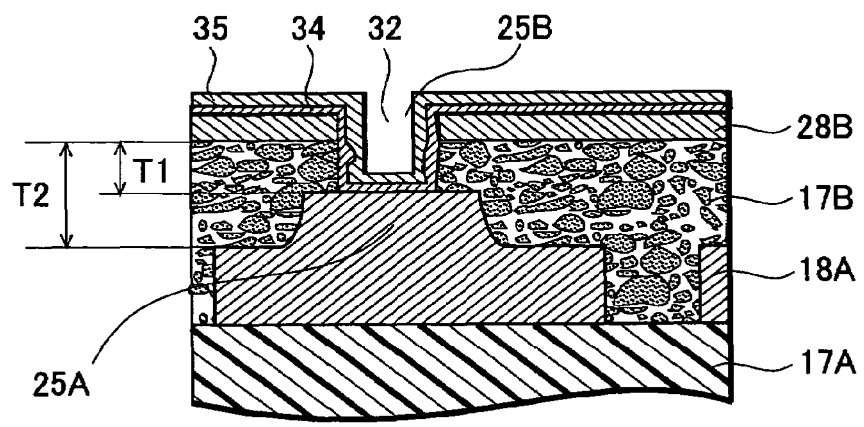
Figure 8C:
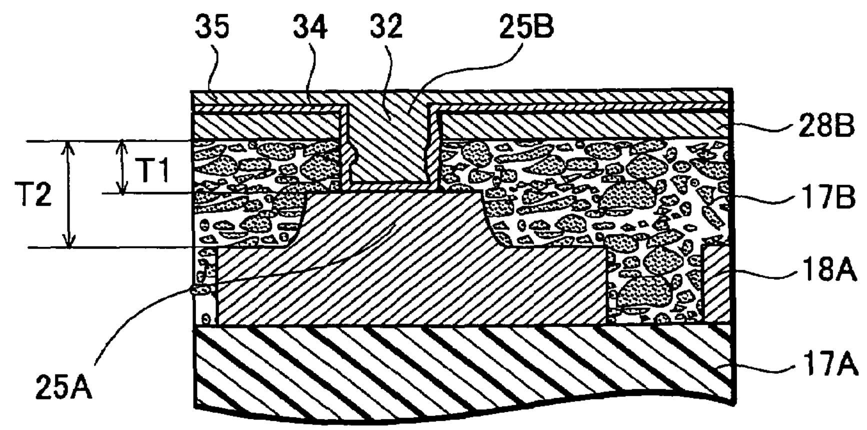

With reference to FIGS. 8A, 8B and 8C, the above-described first method for forming a plating film is described. In FIG. 8A, a plating film 34 is formed on the front face of the second conductive film 28B and the sidewall of the through-hole 32 inclusive, according to an electroless plating process. The thickness of this plating film 34 may be in a range of 3 μm to 5 μm.

Next, in FIG. 8B, another plating film 35 is formed on the top face of the through-hole 34 according to an electrolytic plating method. To be more specific, the plating film 35 is formed using an electrolytic plating method whereby the second conductive film 28B on which the plating film is formed is used as a cathode electrode. On the inner wall of the through-hole 32, the plating film 34 has been formed using the above-described electroless plating method. Therefore, the plating film 35 is formed with a uniform thickness, including that formed on the inner wall of the through-hole 32. With the above-described process, the second connection part 25B formed of a plating film is formed. A specific thickness of the plating film 35 is, for example, approximately 20 μm. For the materials of the above-described plating film 34 and the plating film 35, it is possible to adopt copper which is the same material as that used for the second conductive film 28B. It is also possible to adopt metal other than copper as a material of the plating film 34 and the plating film 35.

In FIG. 8C, here, filling plating is performed, and thereby the plating film 35 is embedded in the through-hole 32. By performing filling plating, the mechanical strength of the second connection part 25B can be increased.

Figure 9A:
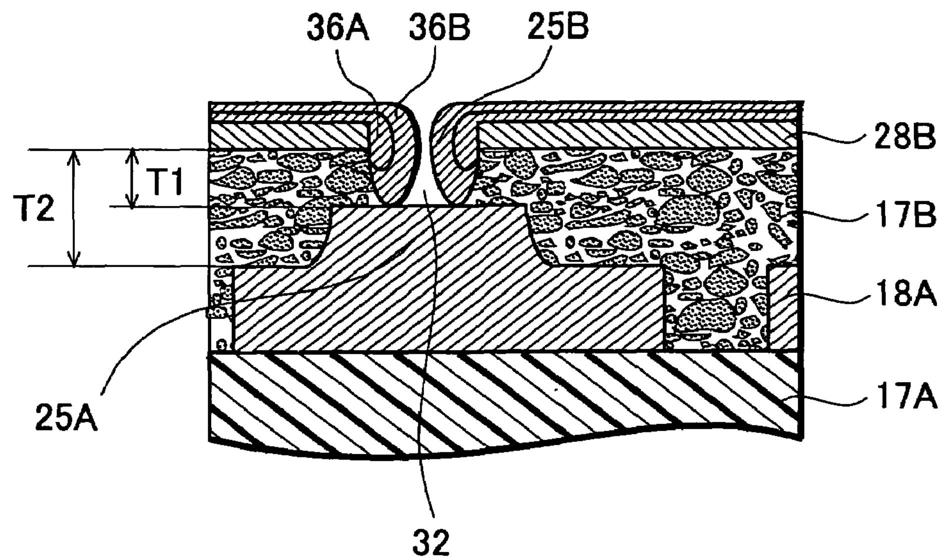
FIGS. 9A and 9B are cross-sectional views showing the manufacturing method of the circuit device according to the embodiment of the present invention.
Figure 9B:
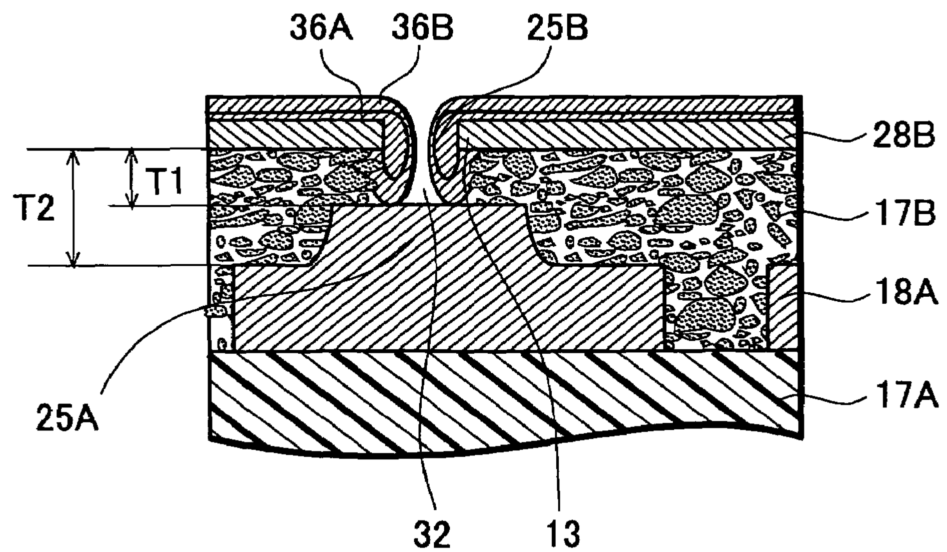

With reference to FIGS. 9A and 9B, a way of forming the second connection part 25B using an electrolytic plating method is described.

In FIG. 9A, first, solution containing metal ion is caused to contact with the through-hole 32. Here, it is possible to adopt copper, gold, silver, palladium or the like as a material for a plating film. When a current is applied by using the second conductive film 28B serving as a cathode electrode, metal is separated out on the second conductive film 28B serving as a cathode electrode, and thereby a plating film is formed. Here, 36A and 36B show how a plating film grows. In the electrolytic plating, a plating film is preferentially formed at a portion where an electric field is high. In the present embodiment, the electric field is high at a portion of the second conductive film 28B, which faces the periphery of the through-hole 32. Therefore, as shown in the drawing, a plating film preferentially grows originating from the portion of the second conductive film 28B, which faces the periphery of the through-hole 32. When the plating film thus formed comes into contact with the first connection part 25A, the first wiring layer 18A and the second conductive film 28B are caused to be conducted. Subsequently, the plating film is uniformly formed inside the through-hole 32. Thereafter, the second connection part 25B, which is integral with the second conductive film 28B, is formed inside the through-hole 32.

With reference to FIG. 9B, another way of forming the second connection part 25B is described. Here, an eave 13 is provided along the circumference of the through-hole 32, facilitating the formation of the second connection part 25B using an electrolytic plating method. Here, the "eave" indicates a portion of the second conductive film 28B which protrudes therefrom, and which covers the periphery of the through-hole 32. A specific way of forming the eave 13 is achieved by increasing the output of a laser when the through-hole 32 is formed with a laser. An increase of the output of a laser causes the removal of the second conductive film 28B to progress in the lateral direction, and thus a resin in a domain below the eave 13 is removed. Under the above conditions, an electrolytic plating process is performed with the second conductive film 28B serving as a cathode electrode, and thus a plating film preferentially grows originating from the eave 13. A plating film grows from the eave 13, and thereby it becomes possible to cause the plating film to preferentially grow in the lower direction as compared to the case in FIG. 9A. Hence, it is possible to securely perform embedding a plating film in the through-hole 32.

As described above, in the present embodiment, the surface of the sidewall of the through-hole 32 is bumpy. Inorganic filler which is mixed into the second insulation layer 17B is exposed from the sidewall of the through-hole 32. These make it difficult to form a plating film on the sidewall of the through-hole 32. Generally, a plating film does not easily bond on the surface of the inorganic filler, and a formation of the plating film becomes particularly difficult when AlN is exposed from the sidewall of the through-hole 32. Therefore, in the present embodiment, the second connection part 25B is formed using the above electrolytic plating method.

Furthermore, in the present embodiment, a plating film is formed on the through-hole 32, and as a natural next step, is formed on the surface of the second conductive film 28B, and hence becomes larger in thickness. However, in the present embodiment, since the plating film is formed on the through-hole 32 with a small depth which is approximately 10 μm as described above, it becomes possible to cause an entire thickness of the formed plating film to be small. Accordingly, since an increase in the thickness of the second conductive film 28B due to the bonding of the plating film is small, the thickness of the second conductive film 28B can be retained small. Hence, it is possible to make finer the second wiring layer 18B which is formed by the second conductive film 28B.

Moreover, even when the through-hole 32 is stuffed by a filling plating process, since the through-hole 32 is formed with a small depth as described above, the filling plating processing can be easily performed.

Figure 10A:
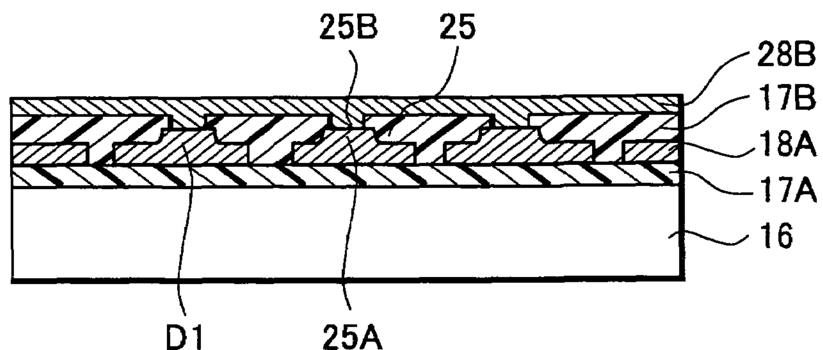
FIGS. 10A, 10B and 10C are cross-sectional views showing the manufacturing method of the circuit device according to the embodiment of the present invention.
Figure 10B:
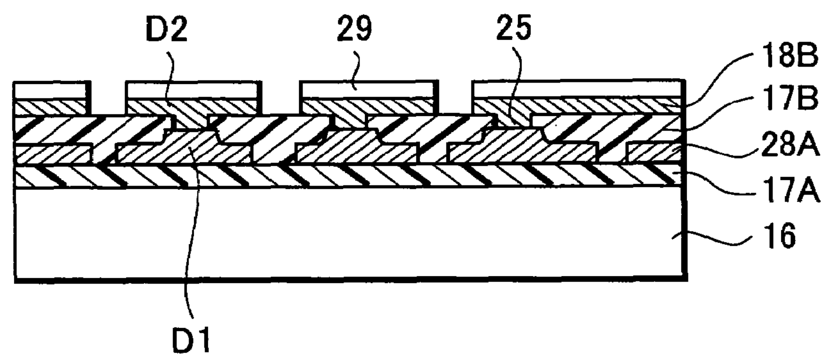
Figure 10C:
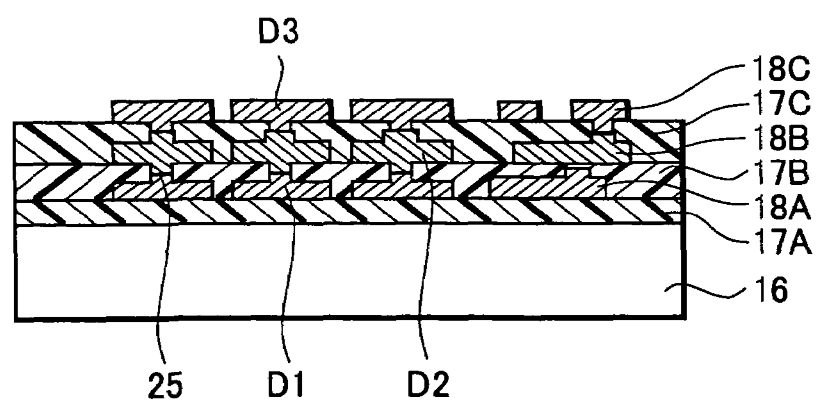

In FIG. 10A, the second connection part 25B is formed, and thus a connection part 25 which is formed by the first connection part 25A and the second connection part 25B. In FIG. 10B, etching is selectively performed using the resist 29, and the second wiring layer 18B is formed. In FIG. 10C, here, a triple-layered wiring is formed by the first wiring layer 18A, the second wiring layer 18B, and the third wiring layer 18C. On the both top and bottom faces of the second wiring layer 18B, there are provided the connection parts 25 which are protruded in a convex shape.

Figure 11A:
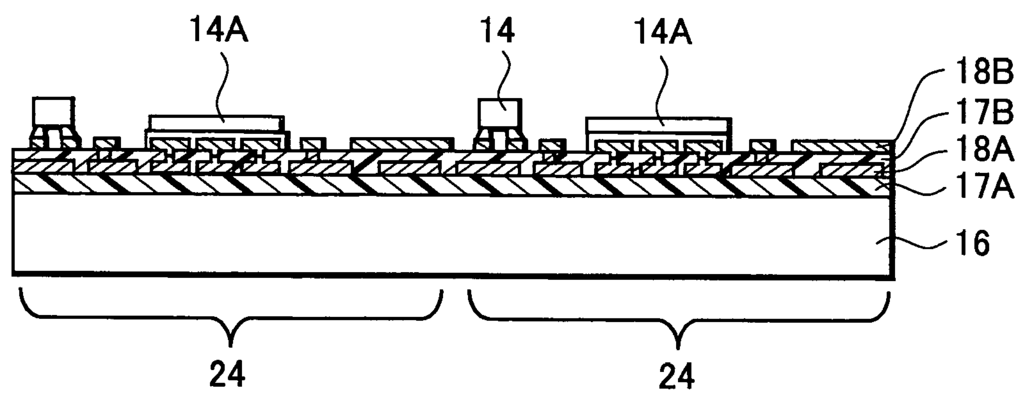
FIGS. 11A and 11B are cross-sectional views showing the manufacturing method of the circuit device according to the embodiment of the present invention.
Figure 11B:
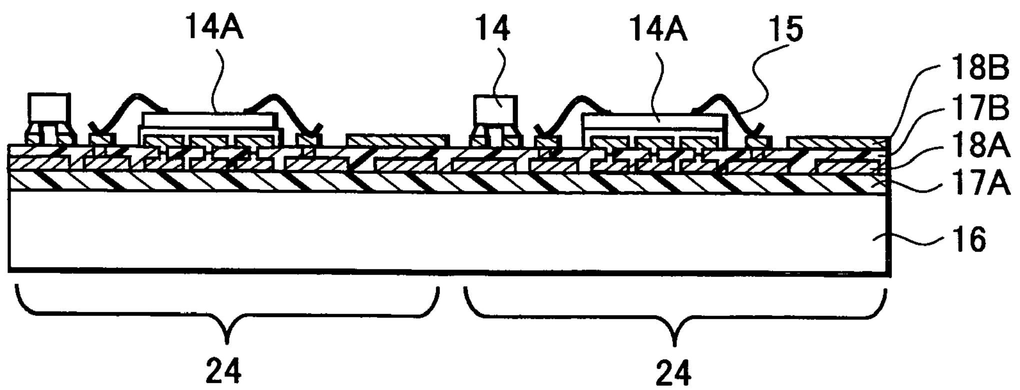

In FIG. 11A, next, a circuit element 14 is fixed to the second wiring layer 18B (island) by way of solder, conductive paste, or the like interposed. Here, while a semiconductor element is mounted face up, it may be mounted face down as needed. Furthermore, in FIG. 11B, the circuit element 14 and the second wiring layer 18B are electrically connected to each other through the metal thin wire 15.

After completing the above processes, units 24 are respectively separated. Separation of the respective units 24 is made through stamping, dicing, folding, and the like using a pressing machine. When dividing is performed through dicing or folding, grooves are provided along the boundaries of the respective units 24 so as to facilitate the dividing thereof. Subsequently, the leads 11 are fixed to the circuit substrates 16 on the respective units 24.

Figure 12:
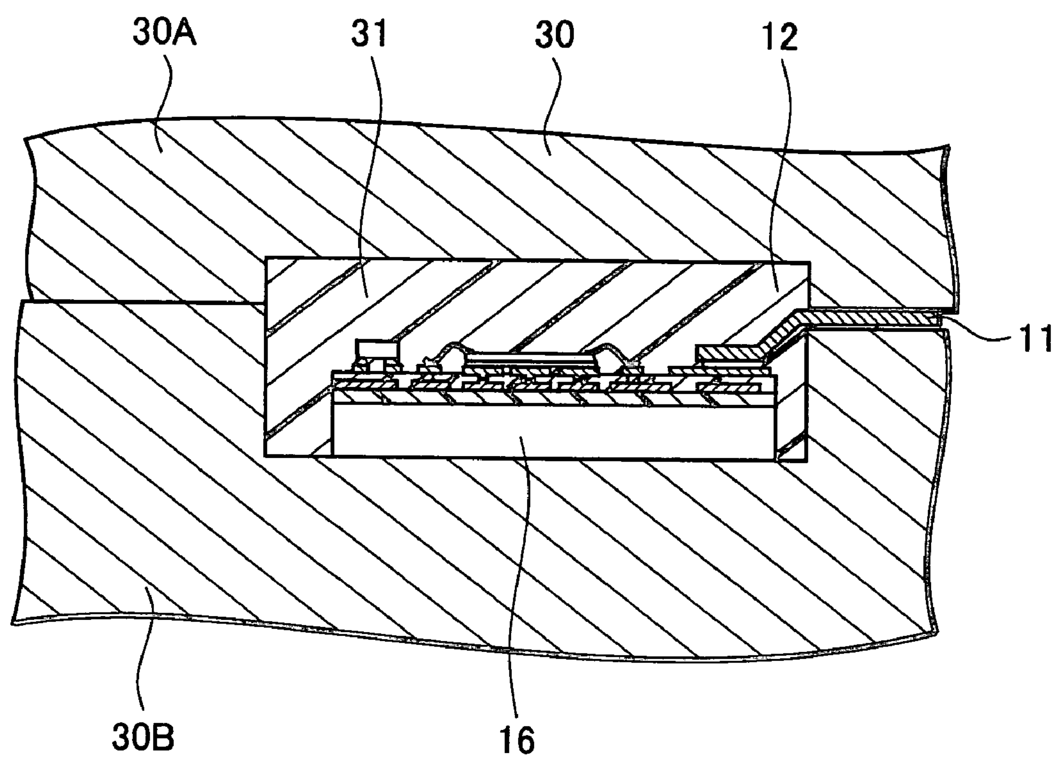
FIG. 12 is a cross-sectional view showing the manufacturing method of the circuit device according to the embodiment of the present invention.

Next, with reference to FIG. 12, resin sealing is performed on each circuit substrate 16. Here, a transfer mold using thermosetting resin is used for the sealing. That is, the circuit substrate 16 is housed in a mold 30 which is formed by an upper mold 30A and a lower mold 30B, and thereafter both molds are meshed with each other so as to fix the leads 11 therebetween. Then, a cavity 31 is filled with resin, hence completing the resin sealing process. According to the above-described processes, a hybrid integrated circuit device which has a structure shown in FIGS. 1A, 1B and 1C for example is manufactured.

Second Embodiment

Figure 13A:
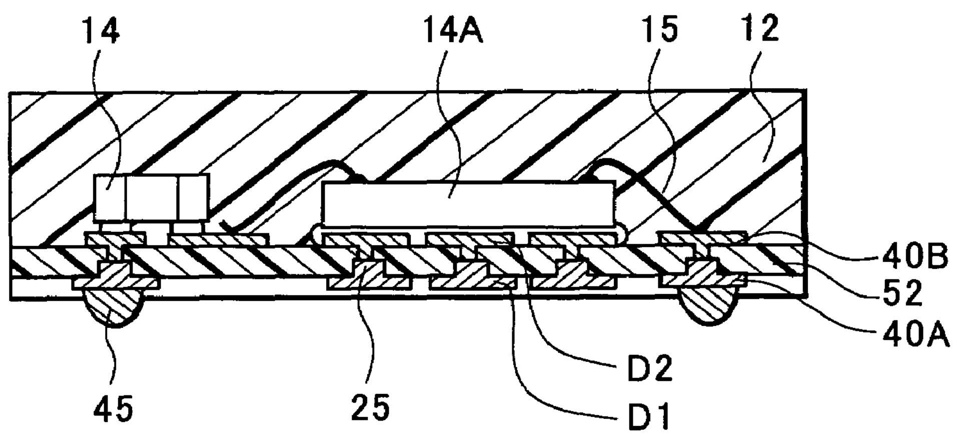
FIGS. 13A and 13B are cross-sectional views showing another manufacturing method of the circuit device according to the embodiment of the present invention.
Figure 13B:
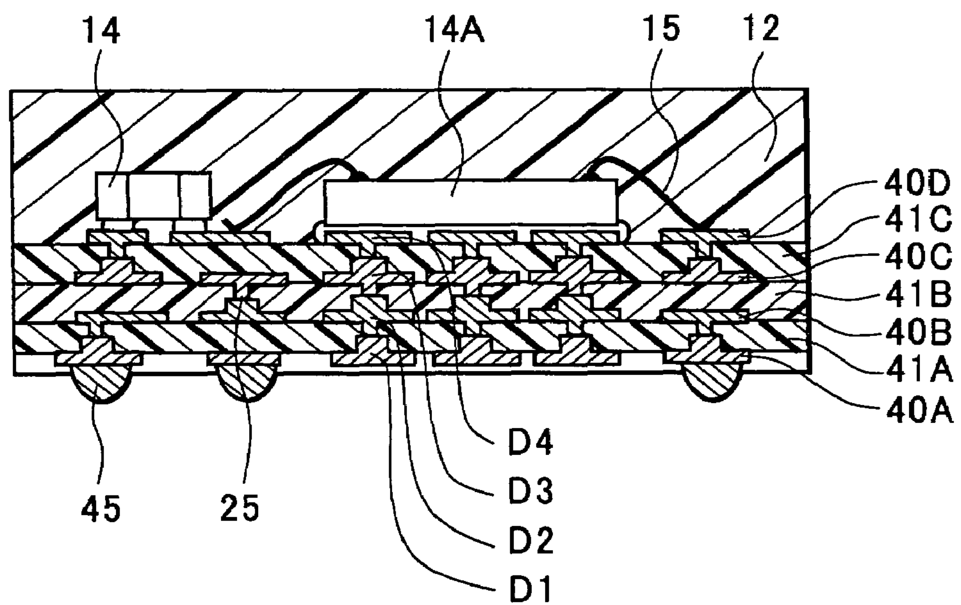

With reference to FIGS. 13A and 13B, a configuration of a circuit device in a second embodiment is described. In the present embodiment, as shown in FIGS. 13A and 13B, the configuration of the circuit device, which is provided with an extremely thin multi-layered wiring, is described. For such a multi-layered wiring, it is still possible to gain the same effect as that described previously by fixing it onto a second dummy pattern D2.

In FIG. 13A, a circuit device of the present embodiment includes a multi-layered wiring which is formed by a first wiring layer 40A, a second wiring layer 40B, and an insulation layer 41 which takes the form of sheet bonding the first wiring layer 40A and the second wiring layer 40B. In addition, a semiconductor element 14A and a circuit element 14 are fixed onto the second wiring layer 40B. The first wiring layer 40A and the second wiring layer 40B are connected with a connection part 25 at a desired position. Further, the first wiring layer 40A includes a first dummy pattern D1 which is electrically independent of electric circuits. The second wiring layer 40B includes a second dummy pattern D2 which is electrically independent of electric circuits. The second dummy pattern D2 is formed right beneath the first dummy pattern D1, and is electrically connected thereto.

Here, the semiconductor element 14A is an element which radiates a large quantity of heat in operation. Hence, the semiconductor element 14A is fixed onto the second dummy pattern D2, and thus the heat dissipation property is enhanced. A specific path for the heat dissipation is: starting from the second dummy pattern D2, passing through the first dummy pattern D1, and ending at the outside. In the present embodiment, the first dummy pattern D1 is formed right beneath the second dummy pattern D2. Therefore, the heat generated can be discharged to the outside at a shortest distance, and thereby the heat dissipation property can be enhanced. Moreover, in the present embodiment, the first dummy pattern D1 and the second dummy pattern D2 are electrically connected. It is, thus, possible to quickly discharge the heat generated by the semiconductor element 14A to the outside. Furthermore, the first dummy pattern D1 and the second dummy pattern D2 are electrically independent of electric circuits. Accordingly, the semiconductor element 14A is free of an influence due to an electric noise, whereby a highly reliable circuit device can be achieved. Meanwhile, an external electrode is formed on the first dummy pattern D1 and connected to a mounting substrate, whereby it is possible to further enhance the heat dissipation property.

With reference to FIG. 13B, another configuration of the circuit device in the present embodiment is described. A basic configuration is the same as that of the circuit device described in FIG. 13A. Here, wiring is formed by four layers, and, on each wiring layer, there is provided a group of dummy patterns, which is divided into a plurality of dummy patterns. On the first wiring layer 40A, a first dummy pattern D1 is formed. On the second wiring layer 40B, a second dummy pattern D2 is formed. On a third wiring layer 40C, a third dummy pattern D3 is formed. On a fourth wiring layer 40D, a fourth dummy pattern D4 is formed. While the dummy patterns formed on the respective wiring layers are electrically connected to the connection part 25, but are independent of electric circuits.

Even for such a multi-layered wiring, the semiconductor element 14A is fixed onto the fourth dummy pattern D4, whereby the effect same as that in the first embodiment can be obtained.

Next, with reference to FIGS. 14A to 16B, a manufacturing method of a circuit device of the present embodiment is described. However, the manufacturing method of the present embodiment described below is applicable to that for other kind of circuit device.

Figure 14A:
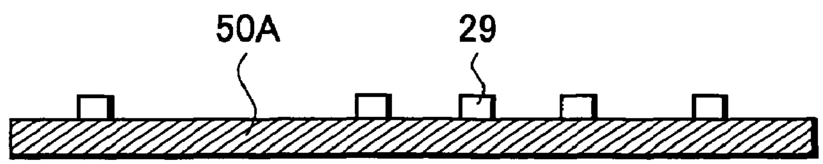
FIGS. 14A, 14B, 14C, 14D and 14E are cross-sectional views showing the manufacturing method of the circuit device according to the embodiment of the present invention.

In FIG. 14A, first, a first conductive sheet 50A is prepared, and a resist 29 is patterned thereon. Here, the resist 29 covers a portion which is supposed to be formed with a large thickness. As the material of the first conductive sheet 50A, it is favorable to adopt a material which consists principally of Cu, or a publicly known lead frame material. The thickness of the first conductive sheet 50A varies depending on the thickness of a formed wiring layer. When the thickness of a conductive pattern which is supposed to be formed is approximately several hundred micrometers, the first conductive sheet 50A having the thickness equal to or larger than that of the conductive pattern is adopted.

Figure 14B:
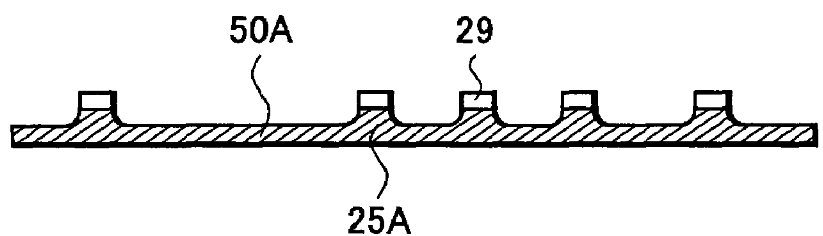

In FIG. 14B, a wet etching is performed with a resist 29 used as an etching mask, whereby an etching is performed on a principal face where the resist 29 is not formed. This etching achieves the etching on a surface of the first conductive sheet 50A in a domain thereof which is not covered with the resist 29, whereby the first connection part 25A is formed.

Figure 14C:
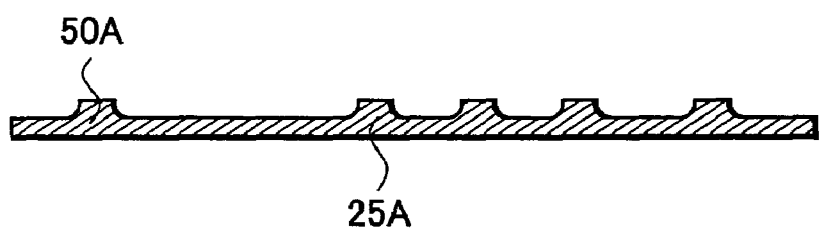

In FIG. 14C, after the first connection part 25A is formed on the first conductive sheet 50A with an etching, the resist 29 is peeled off.

Figure 14D:
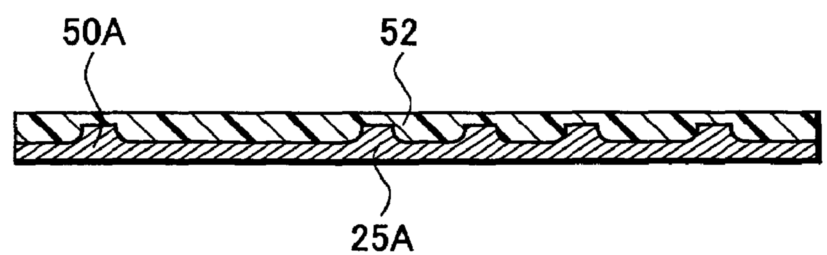

In FIG. 14D, an insulation layer 52 is caused to tightly adhere to the first conductive sheet 50A. At this time, the first connection part 25A is embedded in the insulation layer 52. If this adherence is made with a vacuum press, it becomes possible to prevent the occurrence of a void due to the presence of air between the first conductive sheet 50A and the insulation layer 52. Further, the side face of the first connection part 25A is formed by making use of an isotropic etching, and the side face has a smooth curved surface. Accordingly, when the first conductive sheet 50A is pressed into the insulation layer 52, resin is immersed along this curved surface so that there is no portion left without being filled up. Thus, the occurrence of the void can be prevented also owing to the shape of the side of the first connection part 25A. In addition, the first connection part 25A is embedded in the insulation layer 52, and it thus becomes possible to increase the contact strength between the first conductive sheet 50A and the insulation layer 52.

Figure 14E:
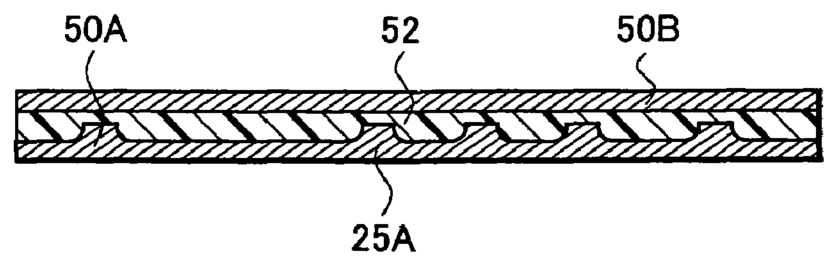

In FIG. 14E, a second conductive sheet 50B is caused to adhere to the insulation layer 52. When the contact is made with the above-described vacuum press, it becomes possible to prevent the occurrence of a void due to the presence of air between the second conductive sheet 50B and the insulation layer 52.

Figure 15A:
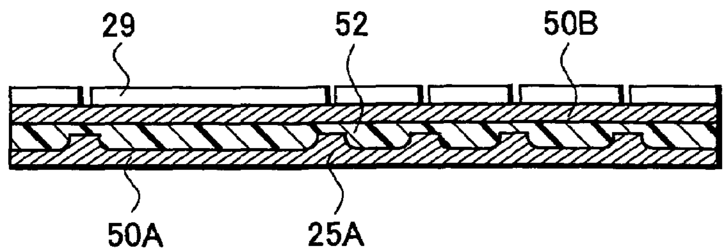
FIGS. 15A, 15B, 15C, 15D and 15E are cross-sectional views showing the manufacturing method of the circuit device according to the embodiment of the present invention.

In FIG. 15A, the resist 29 covers the second conductive sheet 50B only excluding a portion where a through-hole 32 of the second conductive sheet 50B is formed, so that only the portion is exposed. Subsequently, the second conductive sheet 50B is etched through the resist 29. Since the second conductive sheet 50B consists principally of Cu, a chemical etching is performed using iron chloride or cupric chloride as etchant. When this etching is performed, the second conductive sheet 50B is covered with an adhesive sheet or the like to protect it from the etchant. However, if the second conductive sheet 50B is thick enough to be able to maintain the sufficiently flat surface after etching to be, some etching may be allowed.

Figure 15B:
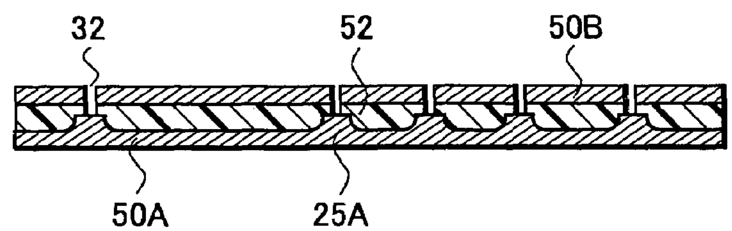

In FIG. 15B, after the resist 29 is removed, the insulation layer 52 right beneath the through-hole 32 is removed using a laser by using the second conductive sheet 50B as a mask, and the back face of the first conductive sheet 50A is exposed to the bottom of the through-hole 32. As the laser, a carbon dioxide laser is favorable. In addition, an insulation resin is evaporated using the laser, and, thereafter, if there are residuals at the bottom of the opening, a wet etching is performed using soda permanganate, ammonium persulfate or the like so as to remove the residuals.

Figure 15C:
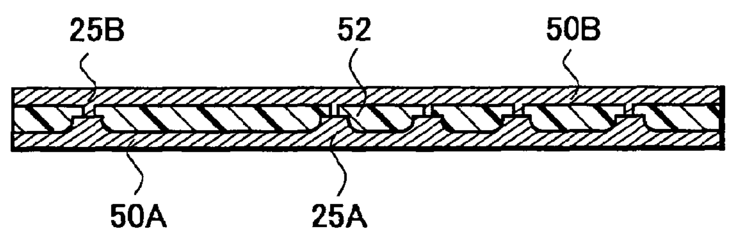

In FIG. 15C, a plating film is formed on the entire surface of the second conductive sheet 50B including the through-hole 32. This forms the second connection part 25B which is used to electrically connect the first conductive sheet 50A and the second conductive sheet 50B. The plating sheet is formed with electroless plating, electrolytic plating, or a combination of electroless plating and electrolytic plating.

Figure 15D:
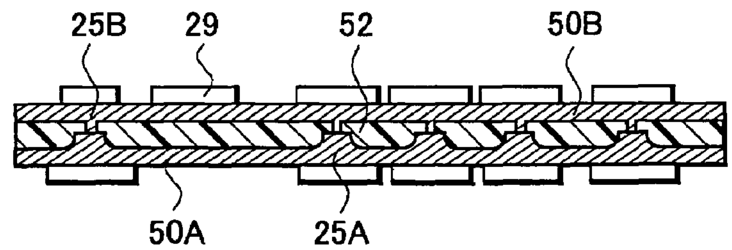

In FIG. 15D, a fresh resist 29 is applied on the first conductive sheet 50A and the second conductive sheet 50B. Next, on the first conductive sheet 50A, the resist 29 is patterned so that the first wiring layer 40A is formed. In the same manner, the resist 29 applied on the second conductive sheet 50B is also patterned.

Figure 15E:
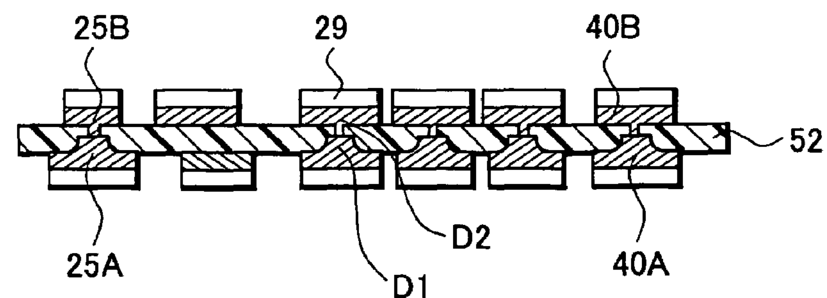

In FIG. 15E, the first conductive sheet 50A and the second conductive sheet 50B are etched through the resist 29 thus formed, and thereby the first wiring layer 40A and the second wiring layer 40B are formed. After completing the etching, the resist 29 is peeled off.

Figure 16A:
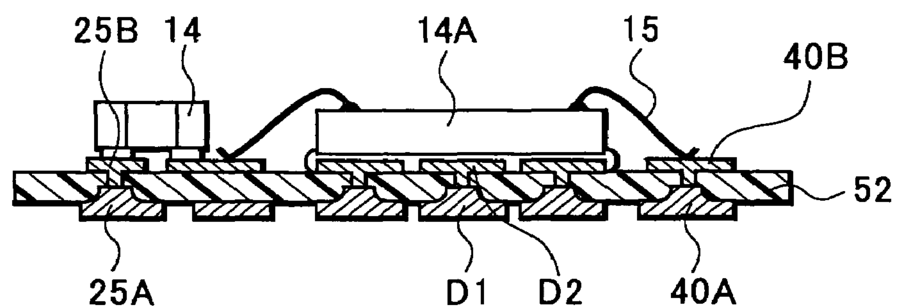
FIGS. 16A and 16B are cross-sectional views showing the manufacturing method of the circuit device according to the embodiment of the present invention.

In FIG. 16A, a semiconductor element 14A and a circuit element 14 are fixed to the second wiring layer 40B (island) with solder, conductive paste or the like interposed therebetween. The circuit element 14 and a conductive pattern are electrically connected through a metal thin wire 15. Here, the semiconductor element 14A is fixed onto the second dummy pattern D2. In addition, the second dummy pattern D2 and the semiconductor element 14A are not electrically connected.

Figure 16B:
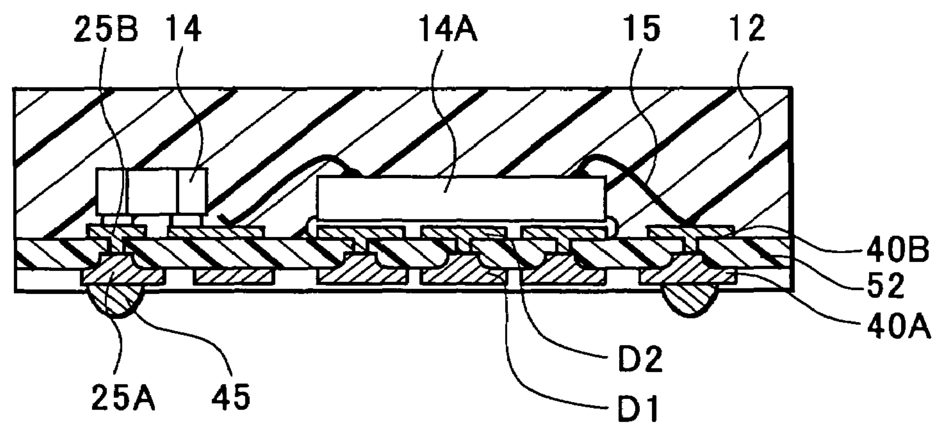
Figure 17A:
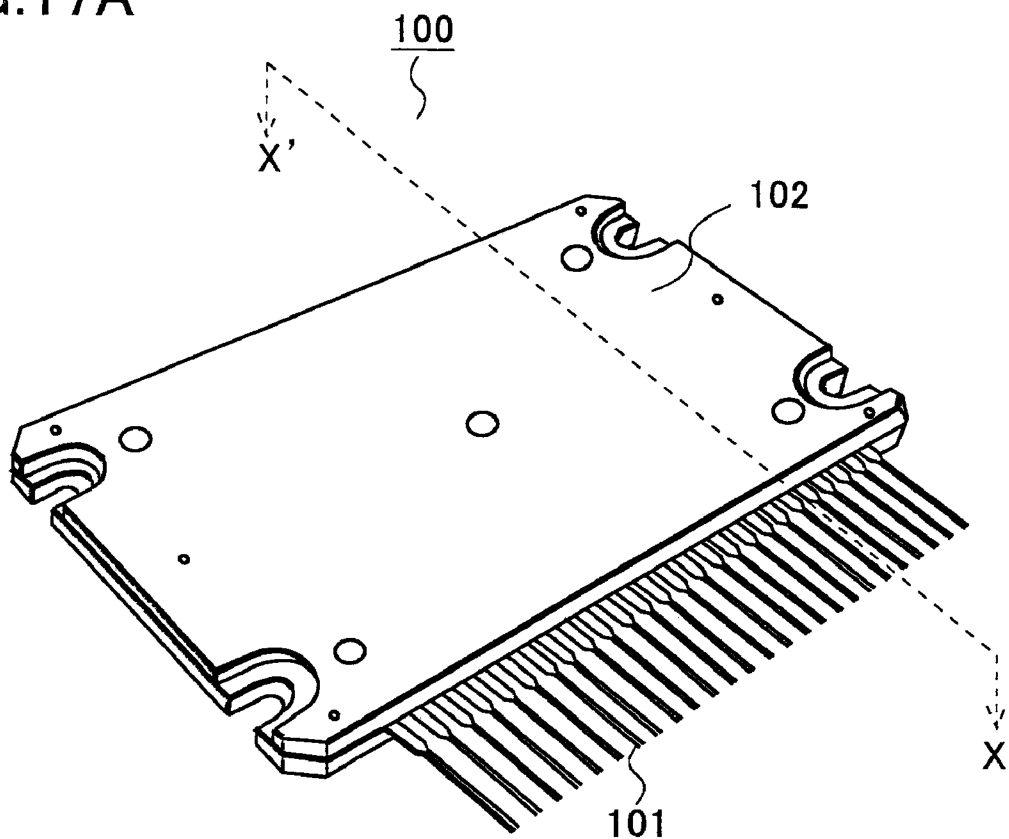
FIGS. 17A and 17B are respectively a perspective view and a cross-sectional view showing a conventional circuit device.
Figure 17B:
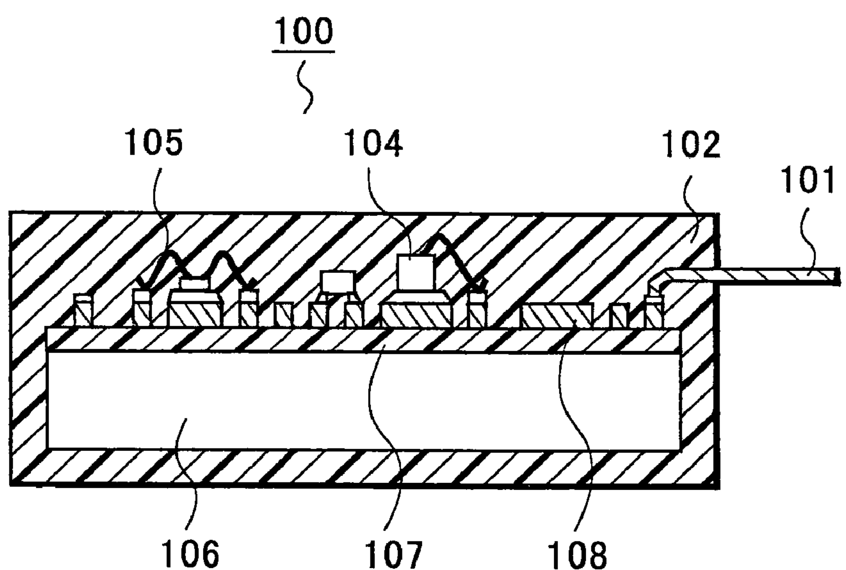

In FIG. 16B, the circuit element 14, the metal thin wire 15, and the second conductive layer 40B are sealed with resin. As a technique for the sealing resin, a transfer mold technique, an injection mold technique, or a dipping technique is adopted. As a resin material, a thermosetting resin such as epoxy resin is adopted in a transfer mold technique, while a thermoplastic resin such as polyimide resin or polyphenylene sulfide is adopted in an injection mold technique. After completing the sealing with resin, the first wiring layer 40A is covered with insulation resin, and an external electrode 45 is disposed, hence completing a circuit device.

What is claimed is:

1. A circuit device comprising:

a board for mounting a circuit element, wherein the board comprises a plurality of wiring layers which are laminated to have multiple layers with an insulation layer interposed therebetween, wherein at least two wiring layers comprise a conductive pattern which is electrically connected to a built-in circuit element and which configures a part of an electric circuit, and a dummy pattern which is electrically independent of the electric circuit, wherein dummy patterns formed on the respective wiring layers are thermally connected to one another with a connection part which penetrates the insulation layer, and wherein the connection part comprises a first connection part which extends upward in a convex shape from the wiring layer located below the insulation layer and a second connection part which extends downward in a convex shape from a wiring layer located above the insulation layer, and the first connection part and the second connection part make contact in the middle of the insulation layer in the thickness-wise direction.

2. The circuit device according to claim 1, wherein the dummy pattern is on each of the wiring layers.

3. The circuit device according to claim 1, wherein dummy patterns are on almost all of the domains thereof on which the conductive patterns are not formed.

4. The circuit device according to claim 1, wherein dummy patterns, which are rectangular and are equal in size, are disposed at uniform intervals.

5. The circuit device according to claim 1, wherein the first connection part comprises copper foil; and the second connection part comprises a plating film.

6. The circuit device according to claim 1, wherein the circuit element is a semiconductor element and the dummy pattern is below the semiconductor element.

7. The circuit device according to claim 1, wherein the dummy pattern is connected to a ground potential.

8. The circuit device according to claim 1, wherein the circuit element is a semiconductor element and the dummy pattern is below a place for providing a clock signal to the semiconductor element.

9. The circuit device according to claim 1, wherein the wiring layers are on an upper surface of a circuit substrate.

10. The circuit device according to claim 9, wherein the circuit element is on the upper surface of the circuit substrate and is covered by a sealing resin.

11. A circuit device comprising:

a board for mounting a circuit element, wherein the board comprises a plurality of wiring layers which are laminated to have multiple layers with an insulation layer interposed therebetween, wherein at least two wiring layers comprise a conductive pattern which is electrically connected to a built-in circuit element and through which an electric signal is adapted to pass, and a dummy pattern through which the electric signal does not pass, wherein dummy patterns on the respective wiring layers are thermally connected to one another with a connection part which penetrates the insulation layer, and wherein the connection part comprises a first connection part which extends upward in a convex shape from the wiring layer located below the insulation layer and a second connection part which extends downward in a convex shape from a wiring layer located above the insulation layer, and the first connection part and the second connection part make contact in the middle of the insulation layer in the thickness-wise direction.

12. The circuit device according to claim 11, wherein the dummy pattern is on each of the wiring layers.

13. The circuit device according to claim 11, wherein dummy patterns are on almost all of the domains thereof on which the conductive patterns are not formed.

14. The circuit device according to claim 11, wherein dummy patterns, which are rectangular and are equal in size, are disposed at uniform intervals.

15. The circuit device according to claim 11, wherein the first connection part comprises copper foil; and the second connection part comprises a plating film.

16. The circuit device according to claim 11, wherein the circuit element is a semiconductor element and the dummy pattern is below the semiconductor element.

17. The circuit device according to claim 11, wherein the dummy pattern is connected to a ground potential.

18. The circuit device according to claim 11, wherein the circuit element is a semiconductor element and the dummy pattern is below a place for providing a clock signal to the semiconductor element.

19. The circuit device according to claim 11, wherein the wiring layers are on an upper surface of a circuit substrate.

20. The circuit device according to claim 19, wherein the circuit element is on the upper surface of the circuit substrate and is covered by a sealing resin.

21. A circuit device comprising:

a board for mounting a circuit element, wherein the board comprises a plurality of wiring layers which are laminated to have multiple layers with an insulation layer interposed therebetween, and a circuit element electrically connected to the wiring layers, wherein at least two wiring layers comprise a conductive pattern which is electrically connected to a built-in circuit element and which configures a part of an electric circuit, and a dummy pattern which is electrically independent of the electric circuit, wherein dummy patterns formed on the respective wiring layers are thermally connected to one another with a connection part which penetrates the insulation layer, and wherein the connection part comprises a first connection part which extends upward in a convex shape from the wiring layer located below the insulation layer and a second connection part which extends downward in a convex shape from a wiring layer located above the insulation layer, and the first connection part and the second connection part make contact in the middle of the insulation layer in the thickness-wise direction.

22. A circuit device comprising:

a board for mounting a circuit element, wherein the board comprises a plurality of wiring layers which are laminated to have multiple layers with an insulation layer interposed therebetween, and a circuit element electrically connected to the wiring layers, wherein at least two wiring layers comprise a conductive pattern which is electrically connected to a built-in circuit element and through which an electric signal is adapted to pass, and a dummy pattern through which the electric signal does not pass, wherein dummy patterns formed on the respective wiring layers are thermally connected to one another with a connection part which penetrates the insulation layer, and wherein the connection part comprises a first connection part which extends upward in a convex shape from the wiring layer located below the insulation layer and a second connection part which extends downward in a convex shape from a wiring layer located above the insulation layer, and the first connection part and the second connection part make contact in the middle of the insulation layer in the thickness-wise direction.

* * * * *